(12) United States Patent
Kim et al.

(10) Patent No.: US 11,423,827 B2
(45) Date of Patent: Aug. 23, 2022

(54) LIGHT EMITTING DISPLAY DEVICE AND FABRICATING METHOD THEREOF

(71) Applicant: SAMSUNG DISPLAY CO., LTD., Yongin-si (KR)

(72) Inventors: Hong Bo Kim, Yongin-si (KR); Won Jun Lee, Yongin-si (KR); Yoon Jung Chai, Yongin-si (KR); Chol Ho Kim, Yongin-si (KR); Hyo Chul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 107 days.

(21) Appl. No.: 16/439,314

(22) Filed: Jun. 12, 2019

(65) Prior Publication Data
US 2020/0005703 A1  Jan. 2, 2020

(30) Foreign Application Priority Data
Jun. 27, 2018  (KR) .......................... 10-2018-0073901

(51) Int. Cl.
*G09G 3/32* (2016.01)
*H01L 27/32* (2006.01)

(52) U.S. Cl.
CPC .......... *G09G 3/32* (2013.01); *H01L 27/3246* (2013.01); *H01L 27/3276* (2013.01)

(58) Field of Classification Search
CPC ...... G09G 3/32; H01L 27/3297; H01L 27/156
See application file for complete search history.

(56) References Cited

U.S. PATENT DOCUMENTS

| 2011/0157110 | A1* | 6/2011 | Chou | H01L 27/3279 345/205 |
|---|---|---|---|---|
| 2014/0346537 | A1* | 11/2014 | Xi | H01L 27/124 257/89 |
| 2018/0204895 | A1* | 7/2018 | Lin | H01L 27/3248 |
| 2019/0157512 | A1* | 5/2019 | Jung | H01L 33/44 |
| 2019/0198582 | A1* | 6/2019 | Yeo | H01L 27/3276 |

FOREIGN PATENT DOCUMENTS

| KR | 10-2005-0068199 A | 7/2005 |
|---|---|---|
| KR | 10-1022572 B1 | 3/2011 |

* cited by examiner

*Primary Examiner* — Yuzhen Shen
(74) *Attorney, Agent, or Firm* — Lewis Roca Rothgerber Christie LLP

(57) ABSTRACT

A display device includes: a substrate including a display region including a plurality of pixel regions, and a non-display region at a periphery of the display region; a pixel circuit layer including a plurality of circuit elements in the display region; a display element layer including a plurality of light emitting devices in the display region on the pixel circuit layer; and first and second alignment lines in the non-display region, the first and second alignment lines each having a multi-layered structure. Each of the first and second alignment lines includes: a main line in a same layer as at least one electrode in the display element layer; and at least one sub-line electrically connected to the main line, the at least one sub-line in a same layer as at least one electrode in the pixel circuit layer.

18 Claims, 25 Drawing Sheets

LIGHT EMITTING DISPLAY DEVICE AND
FABRICATING METHOD THEREOF

CROSS-REFERENCE TO RELATED
APPLICATION

This application claims priority to and the benefit of Korean Patent Application No. 10-2018-0073901, filed on Jun. 27, 2018 in the Korean Intellectual Property Office, the entire disclosure of which is incorporated herein by reference.

BACKGROUND

1. Field

Aspects of embodiments of the present disclosure relate to a light emitting display device and a fabricating method thereof.

2. Description of Related Art

A light emitting display device displays a high-quality image, using a light emitting device such as a light emitting diode as a light source of each pixel. The light emitting diode exhibits relatively satisfactory durability even in poor environmental conditions and has excellent performance in terms of life span and luminance.

Recently, there have been conducted studies for using a micro light emitting diode as a next-generation pixel light source by fabricating the micro light emitting diode, using a material having an inorganic crystal structure with high reliability and disposing the micro light emitting diode in a panel (herein, referred to as a "light emitting display panel") of a light emitting display device. As a part of such studies, there has been developed a light emitting display device using, as a light source of each pixel, a micro light emitting diode fabricated to be small to a degree of micro or nano scale.

SUMMARY

According to aspects of embodiments, a light emitting display device is capable of improving fabrication efficiency while easily aligning light emitting devices in each pixel region, and a fabricating method of the light emitting display device is provided.

According to one or more embodiments of the present disclosure, a light emitting display device includes: a substrate including a display region including a plurality of pixel regions, and a non-display region at a periphery of the display region; a pixel circuit layer including a plurality of circuit elements in the display region; a display element layer including a plurality of light emitting devices in the display region on the pixel circuit layer; and first and second alignment lines in the non-display region, the first and second alignment lines each having a multi-layered structure, wherein each of the first and second alignment lines includes: a main line in a same layer as at least one electrode in the display element layer; and at least one sub-line electrically connected to the main line, the at least one sub-line in a same layer as at least one electrode in the pixel circuit layer.

The first and second alignment lines may be on opposite end portions of the substrate so as to face each other with the display region therebetween.

The first alignment line may be spaced from pixels of the display region, and the second alignment line may be connected to the pixels of the display region.

The display element layer may include: first and second pixel electrodes in each pixel region on the pixel circuit layer; and the light emitting devices between the first and second pixel electrodes of the pixel region.

The main line of each of the first and second alignment lines may be in a same layer as at least one of the first and second pixel electrodes.

The first and second pixel electrodes may be in a same layer in the pixel region to be spaced apart from each other. First end portions of the light emitting devices may be electrically connected to a first pixel electrode of a corresponding pixel, and second end portions of the light emitting devices may be electrically connected to a second pixel electrode of the corresponding pixel.

The display element layer may further include: first contact electrodes on the first end portions of the light emitting devices to connect the first end portions of the light emitting devices to each first pixel electrode; and second contact electrodes on the second end portions of the light emitting devices to connect the second end portions of the light emitting devices to each second pixel electrode.

Each of the light emitting devices may include: a first semiconductor layer doped with a first conductive dopant; a second semiconductor layer doped with a second conductive dopant; and an active layer provided between the first semiconductor layer and the second semiconductor layer.

Each of the light emitting devices may be a bar type light emitting diode having a micro or nano scale.

The light emitting display device may further include a first insulating layer, a second insulating layer, a third insulating layer, and a fourth insulating layer, which are sequentially stacked between the substrate and the display element layer.

The pixel circuit layer may include a transistor in each pixel region of the display region. The transistor may include: a semiconductor layer between the substrate and the first insulating layer; a gate electrode between the first insulating layer and the second insulating layer, the gate electrode overlapping with at least one region of the semiconductor layer; and a first electrode between the third insulating layer and the fourth insulating layer, the first electrode being electrically connected to the semiconductor layer.

The pixel circuit layer may further include a capacitor in each pixel region of the display region. The capacitor may include: a first capacitor electrode between the second insulating layer and the third insulating layer; and a second capacitor electrode in a same layer as at least one of the semiconductor layer, the gate electrode, and the first electrode.

The at least one sub-line may include at least one of: a first sub-line between the third insulating layer and the fourth insulating layer; a second sub-line between the second insulating layer and the third insulating layer; a third sub-line between the first insulating layer and the second insulating layer; and a fourth sub-line between the substrate and the first insulating layer.

The at least one sub-line may have a multi-layered structure including at least two sub-lines among the first to fourth sub-lines.

According to one or more embodiments of the present disclosure, a method of fabricating a light emitting display device includes: preparing a substrate including a display region and a non-display region; forming a pixel circuit layer on the display region of the substrate while forming a sub-line of each of a first alignment line and a second alignment line on the non-display region of the substrate; forming a first pixel electrode and a second pixel electrode on each pixel region of the display region while forming a main line of each of the first alignment line and the second alignment line on the non-display region of the substrate; supplying a plurality of light emitting devices onto the pixel region, and aligning the light emitting devices by applying power to the first alignment line and the second alignment line; and forming a first contact electrode and a second contact electrode, which respectively connect a first end portion and a second end portion of each of the light emitting devices to the first pixel electrode and the second pixel electrode.

The forming of the sub-line may include forming at least one electrode in the pixel circuit layer while forming at least one sub-line in a same layer as the at least one electrode.

The forming of the main line may include forming the main line of each of the first and second alignment lines on the sub-line of each of the first and second alignment lines to be electrically connected to the sub-line.

BRIEF DESCRIPTION OF THE DRAWINGS

Some example embodiments will now be described more fully herein with reference to the accompanying drawings; however, the present disclosure may be embodied in different forms and should not be construed as limited to the embodiments set forth herein. Rather, these embodiments are provided so that this disclosure will be thorough and complete, and will fully convey the scope of the present disclosure to those skilled in the art.

In the drawing figures, dimensions may be exaggerated for clarity of illustration. Like reference numerals refer to like elements throughout.

DETAILED DESCRIPTION

The present disclosure may have various changes and different shapes and is only illustrated herein with respect to some particular examples. However, the examples do not limit the present disclosure.

In the following description of embodiments and the drawings, elements not directly related to the present disclosure may be omitted, and dimensional relationships among individual elements in the attached drawings may be illustrated for ease of understanding and may not depict the actual scale.

The terms, for example, "first," "second," etc. in the present specification may be used to represent various components, and such components are not limited to the terms. In the specification, when an element is referred to as being "connected" or "coupled" to another element, it may be directly connected or coupled to the another element or may be indirectly connected or coupled to the another element with one or more intervening elements interposed therebetween. In addition, a specific position, direction, or the like, which is defined in the following description may be described from a relative viewpoint, and may be reversely changed depending on a viewpoint or direction. It is to be understood that when an element is referred to as being "between" two elements, it can be the only element between the two elements, or one or more intervening elements may also be present.

Herein, some exemplary embodiments of the present disclosure will be described in further detail with reference to the accompanying drawings. Singular forms in the present disclosure are intended to include the plural forms as well, unless the context clearly indicates otherwise.

Figure 1:
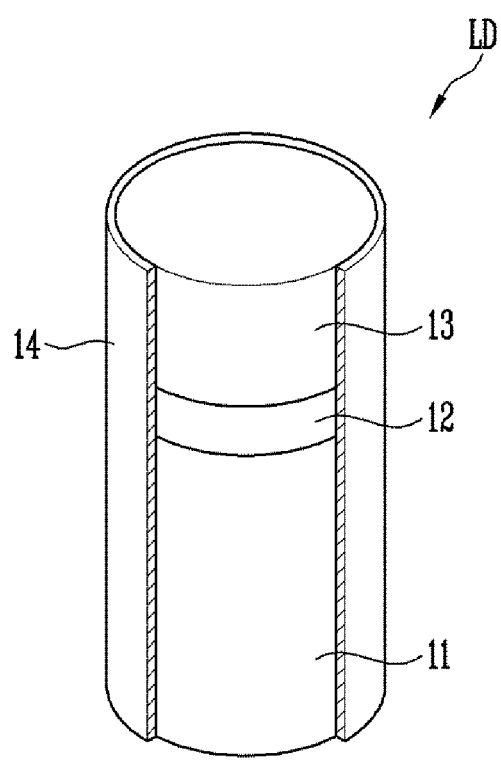
FIG. 1 is a perspective view illustrating a light emitting device according to an embodiment of the present disclosure.

FIG. 1 is a perspective view illustrating a light emitting device LD according to an embodiment of the present disclosure. In FIG. 1, a cylindrical column-shaped bar type light emitting diode is illustrated as an example of the light emitting device LD, but the kind and/or shape of the light emitting device LD according to the present disclosure is not limited thereto.

Referring to FIG. 1, the light emitting device LD according to an embodiment of the present disclosure may include a first semiconductor layer 11, a second semiconductor layer 13, and an active layer 12 provided between the first and second semiconductor layers 11 and 13. In an example, the light emitting device LD may be implemented with a stack structure in which the first semiconductor layer 11, the active layer 12, and the second semiconductor layer 13 are sequentially stacked.

In some embodiments, the light emitting device LD may be provided in a bar shape extending along a direction. When assuming that the extending direction of the light emitting device LD is a length direction, the light emitting device LD may have one end portion and the other end portion along the length direction.

In some embodiments, one of the first and second semiconductor layers 11 and 13 may be disposed at the one end portion of the light emitting device LD, and the other of the first and second semiconductor layers 11 and 13 may be disposed at the other end portion of the light emitting device LD.

In some embodiments, the light emitting device LD may be fabricated in a bar shape. The term "bar type" or "bar shape" may include a rod-like shape or bar-like shape, which is long in its length direction (e.g., aspect ratio is greater than 1), such as a cylindrical column or a polygonal column, and a shape of its cross-section is not particularly limited. For example, the light emitting device LD may have a length greater than a diameter thereof.

In some embodiments, the light emitting device LD may have a size small to a degree of micro or nano scale (e.g., a diameter and/or a length small to a degree of micro or nano scale). However, the size of the light emitting device LD is not limited thereto. For example, the size of the light emitting device LD may be variously changed depending on a design condition of a light emitting display device or the like, which uses the light emitting device LD.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN, and may include a semiconductor layer doped with a first conductive dopant, such as Si, Ge, or Sn. However, a material constituting the first semiconductor layer 11 is not limited thereto. For example, various materials may be included in the first semiconductor layer 11.

The active layer 12 is formed on the first semiconductor layer 11, and may be formed in a single or multiple quantum well structure. In an embodiment, a clad layer (not shown) doped with a conductive dopant may be formed on the top and/or the bottom of the active layer 12. In an example, the clad layer may be implemented as an AlGaN layer or InAlGaN layer. In some embodiments, a material such as AlGaN or AlInGaN may be used to form the active layer 12. In addition, various materials may be included in the active layer 12.

When an electric field having a certain voltage (e.g., a predetermined voltage) or more is applied to both ends of the light emitting device LD, the light emitting device LD emits light as electron-hole pairs are combined in the active layer 12. The emission of the light emitting device LD is controlled using such a principle, such that the light emitting device LD may be used as a light source of a pixel.

The second semiconductor layer 13 is formed on the active layer 12, and may include a semiconductor layer having a type different from that of the first semiconductor layer 11. In an example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a semiconductor layer doped with a second conductive dopant, such as Mg. However, the material constituting the second semiconductor layer 13 is not limited thereto. In addition, various materials may be included in the second semiconductor layer 13.

In an embodiment, the light emitting device LD may further include an additional component in addition to the first semiconductor layer 11, the active layer 12, and the second semiconductor layer 13. In an example, the light emitting device LD may additionally include one or more phosphor layers, one or more active layers, one or more semiconductor layers, and/or one or more electrode layers, which are disposed on the top and/or the bottom of the first semiconductor layer 11, the active layer 12, and/or the second semiconductor layer 13.

In some embodiments, the light emitting device LD may further include an insulative film 14. In some embodiments, the insulative film 14 may be formed to surround the outer circumference of at least the active layer 12. In addition, the insulative film 14 may further surround at least a portion of the first and second semiconductor layers 11 and 13.

Although FIG. 1 illustrates that a portion of the insulative film 14 is removed so as to clearly show the stack structure of the light emitting device LD, the insulative film 14 may entirely surround an outer circumferential surface (e.g., a side surface of a cylindrical column) except both end portions of the light emitting device LD. In another embodiment, the insulative film 14 may cover only a partial region among side surfaces of the first semiconductor layer 11, the active layer 12, and/or the second semiconductor layer 13. In still another embodiment, the insulative film may be omitted.

In some embodiments, the insulative film 14 may include a transparent insulating material. For example, the insulative film 14 may include at least one insulating material selected from the group consisting of $SiO_2$, $Si_3N_4$, $Al_2O_3$, and $TiO_2$; however, the present disclosure is not limited thereto. That is, various materials currently known in the art may be included in the insulative film 14.

When the insulative film 14 is provided in the light emitting device LD, the active layer 12 of the light emitting device LD can be prevented or substantially prevented from being short circuited with a first electrode (not shown) and/or a second electrode (not shown). Accordingly, the electrical stability of the light emitting device LD can be provided.

Further, when the insulative film 14 is formed on a surface of the light emitting device LD, a surface defect of the light emitting device LD is minimized or reduced, such that the life span and efficiency of the light emitting device LD can be improved. Further, when the insulative film 14 is formed in each light emitting device LD, an unwanted short circuit can be prevented or substantially prevented from occurring between a plurality of light emitting devices LD even when the plurality of light emitting devices LD are densely disposed.

The above-described light emitting device LD may be used as a light source in any of various types of display devices including a light emitting display device. In an example, at least one light emitting device LD may be disposed in each pixel region of a light emitting display panel, thereby constituting a light emitting unit of each pixel. However, in the present disclosure, the application field of the light emitting device LD is not limited to display devices. For example, the light emitting device LD may be used in another type of light emitting device that requires a light source, such as a lighting device.

Figure 2:
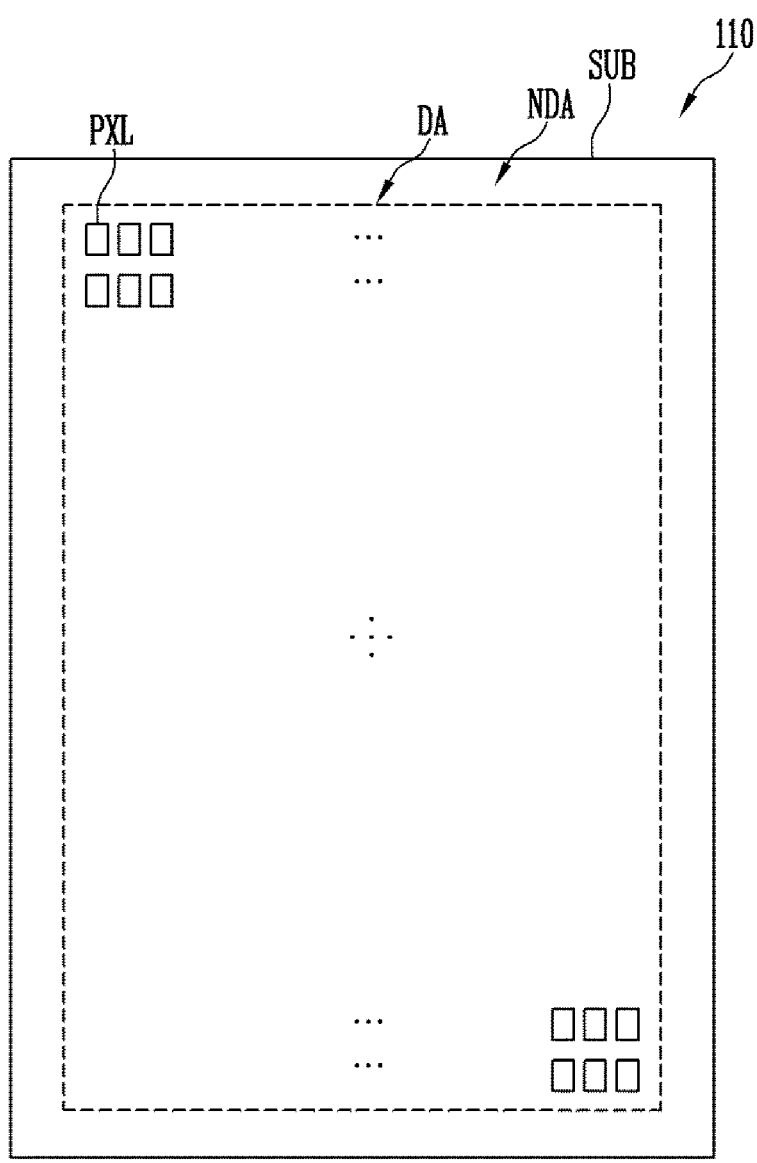
FIG. 2 is a plan view schematically illustrating a light emitting display panel according to an embodiment of the present disclosure.
Figure 3:
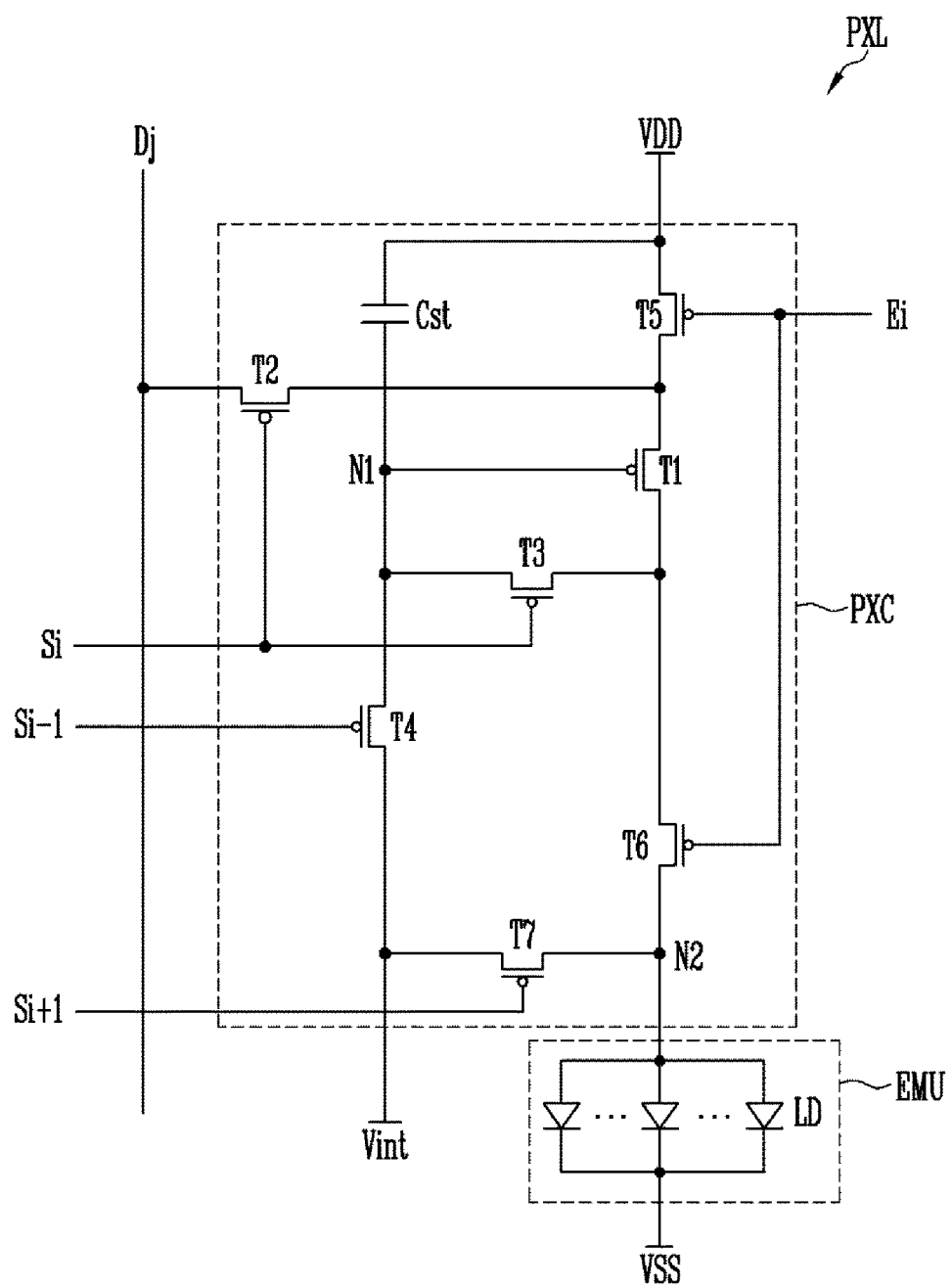
FIG. 3 is a circuit diagram illustrating an embodiment of a pixel provided in the light emitting display panel of FIG. 2.

FIG. 2 is a plan view schematically illustrating a light emitting display panel 110 according to an embodiment of the present disclosure; and FIG. 3 is a circuit diagram illustrating an embodiment of a pixel PXL provided in the light emitting display panel 110 of FIG. 2. In some embodiments, a structure of the light emitting display panel 110 based on a display region DA will be briefly illustrated in FIGS. 2 and 3. However, in some embodiments, at least one driving circuit layer (e.g., a scan driver and a data driver) and/or a plurality of lines, which are not shown, may further be disposed in the light emitting display panel 110.

Referring to FIG. 2, the light emitting display panel 110 may include a substrate SUB and a plurality of pixels PXL arranged on the substrate SUB. The light emitting display panel 110 may include a display region DA for displaying an image and a non-display region NDA except the display region DA. In addition, the pixels PXL may be arranged in the display region DA on the substrate SUB.

In some embodiments, the display region DA may be disposed in a central region of the light emitting display panel 110, and the non-display region NDA may be disposed in an edge region of the light emitting display panel 110 to surround the display region DA. However, the positions of the display region DA and the non-display region NDA are not limited thereto, and may be changed.

The substrate SUB may be a rigid substrate or a flexible substrate, and a material or property of the substrate SUB is not particularly limited. For example, the substrate SUB may be a rigid substrate configured with glass or tempered glass, or a flexible substrate configured with a thin film made of plastic or metal.

One region of the substrate SUB is defined as the display region DA such that the pixels PXL are arranged therein, and the other region of the substrate SUB is defined as the non-display region NDA. In an example, the substrate SUB may include the display region DA including a plurality of pixel regions in which the respective pixels PXL are formed, and the non-display region NDA disposed at a periphery of the display region DA. Various lines and/or a built-in circuit, connected to the pixels PXL of the display region DA may be disposed in the non-display region NDA.

Each of the pixels PXL may include at least one light emitting device LD, e.g., at least one bar type light emitting diode shown in FIG. 1, which is driven by a corresponding scan signal and a corresponding data signal. For example, each of the pixels PXL may include a plurality of bar type light emitting diodes that have a size small to a degree of micro or nano scale and are connected in parallel to each other. The plurality of bar type light emitting diodes may constitute a light source of each pixel PXL.

In an embodiment, each of the pixels PXL may be configured as an active pixel shown in FIG. 3 and the like. However, the kind, structure, and/or driving method of the pixels PXL are not particularly limited. For example, each of the pixels PXL may be configured as a pixel of a passive or active light emitting display device having any of various structures currently known in the art.

Referring to FIG. 3, each of the pixels PXL may include a light emitting unit EMU for generating light with a luminance corresponding to a data signal and a pixel circuit for driving the light emitting unit EMU.

In some embodiments, the light emitting unit EMU may include a plurality of light emitting devices LD connected in parallel between first and second pixel power sources VDD and VSS. The first and second pixel power sources VDD and VSS may have different potentials such that the light emitting devices LD can emit light. In an example, the first pixel power source VDD may be set as a high-potential pixel power source, and the second pixel power source VSS may be set as a low-potential pixel power source. In addition, the potential difference between the first and second pixel power sources VDD and VSS during an emission period of each pixel PXL may be set to a voltage equal to or higher than a threshold voltage of the light emitting devices LD.

Although FIG. 3 illustrates an embodiment in which the light emitting devices LD constituting the light emitting unit EMU of each pixel PXL are connected in parallel in a same direction (e.g., a forward direction) between the first and second pixel power sources VDD and VSS, the present disclosure is not limited thereto. For example, in another embodiment, some of the light emitting devices LD may be connected in the forward direction between the first and second pixel power sources VDD and VSS, others of the light emitting devices LD may be connected in a reverse direction, and one of the first and second pixel power sources VDD and VSS may be supplied in the form of an AC voltage. The light emitting devices LD may alternately emit lights for each group having the same direction in which light emitting devices LD are connected. In still another embodiment, each pixel PXL may include only a single light emitting device LD.

In some embodiments, one end portion of light emitting devices LD constituting each light emitting unit EML may be commonly connected to a corresponding pixel circuit PXC through a first pixel electrode (not shown), and be connected to the first pixel power source VDD through the pixel circuit PXC. In addition, the other end portions of the light emitting devices LD may be commonly connected to the second pixel power source VSS through a second pixel electrode (not shown).

Each light emitting unit EMU may emit light with a luminance corresponding to a driving current supplied through a corresponding pixel circuit PXC. Accordingly, a predetermined image can be displayed in the display region DA.

When light emitting devices LD are aligned in each pixel PXL, first and second pixel electrodes of each light emitting unit EMU may be respectively connected to first and second alignment lines (not shown). An AC voltage AC may be applied to the first alignment line, and a ground voltage GND may be applied to the second alignment line. In another embodiment, the ground voltage may be applied to the first alignment line, and the AC voltage may be applied to the second alignment line.

When voltages having different levels are respectively applied to the first alignment line and the second alignment line, an electric field is formed between the first pixel electrode and the second pixel electrode, such that the light emitting devices LD can be aligned between the first and second pixel electrodes.

The pixel circuit PXC may be connected to a scan line Si and a data line Dj of a corresponding pixel PXL. In an example, when assuming that the pixel PXL is disposed on an ith row and a jth column of the display region DA, the pixel circuit PXC of the pixel PXL may be connected to the ith scan line Si and the jth data line Dj of the display region DA.

In some embodiments, the pixel circuit PXC may be further connected to at least another scan line. For example, each of pixels PXL disposed on the ith row of the display region DA may be further connected to an (i−1)th scan line Si−1 and/or an (i+1)th scan line Si+1. In some embodiments, the pixel circuit PXC may be further connected to a third power source in addition to the first and second pixel power sources VDD and VSS. For example, the pixel circuit PXC may also be connected to an initialization power source Vint.

In an embodiment, the pixel circuit PXC may include first to seventh transistors T1 to T7 and a storage capacitor Cst.

In an embodiment, one electrode, e.g., a source electrode of the first transistor (driving transistor) T1 is connected to the first pixel power source VDD via the fifth transistor T5, and another electrode, e.g., a drain electrode of the first transistor T1 is connected to one end portion of the light emitting devices LD via the sixth transistor T6. In addition, a gate electrode of the first transistor T1 is connected to a first node N1. The first transistor T1 controls a driving voltage flowing from the first pixel power source VDD and the second pixel power source VSS via the light emitting devices LD, corresponding to a voltage of the first node N1.

The second transistor (switching transistor) T2 is connected between a corresponding data line Dj and the source electrode of the first transistor T1. In addition, a gate electrode of the second transistor T2 is connected to a corresponding scan line Si. The second transistor T2 is turned on when a scan signal having a gate-on voltage (e.g., a low voltage) is supplied to the scan line Si, to electrically connect the data line Dj to the source electrode of the first transistor T1. Therefore, when the second transistor T2 is turned on, a data signal supplied from the data line Dj is transferred to the first transistor T1.

The third transistor T3 is connected between the drain electrode of the first transistor T1 and the first node N1. In addition, a gate electrode of the third transistor T3 is connected to the corresponding scan line Si. The third transistor T3 is turned on when a scan signal having the gate-on voltage is supplied to the scan line Si, to electrically connect the drain electrode of the first transistor T1 and the first node N1. Therefore, when the third transistor T3 is turned on, the first transistor T1 is diode-connected.

The fourth transistor T4 is connected between the first node N1 and the initialization power source Vint. In addition, a gate electrode of the fourth transistor T4 is connected to a previous scan line, e.g., an (i−1)th scan line Si−1. The fourth transistor T4 is turned on when a scan signal having the gate-on voltage is supplied to the (i−1)th scan line Si−1, to supply the voltage of the initialization power source Vint to the first node N1. The initialization power source Vint may have a voltage equal to or lower than the lowest voltage of the data signal.

The fifth transistor T5 is connected between the first pixel power source VDD and the first transistor T1. In addition, a gate electrode of the fifth transistor T5 is connected to a corresponding emission control line, e.g., an ith emission control line Ei. The fifth transistor T5 is turned off when an emission control signal having a gate-off voltage is supplied to the emission control line Ei, and is turned on otherwise.

The sixth transistor T6 is connected between the first transistor T1 and the one end portions of the light emitting devices LD. In addition, a gate electrode of the sixth transistor T6 is connected to the corresponding emission control line, e.g., the ith emission control line Ei. The sixth transistor T6 is turned off when an emission control signal having the gate-off voltage is supplied to the emission control line Ei, and is turned on otherwise.

The seventh transistor T7 is connected between the one end portion of the light emitting devices LD and the initialization power source Vint. In addition, a gate electrode of the seventh transistor T7 is connected to any one of scan lines of a next stage, e.g., an (i+1)th scan line Si+1. The seventh transistor T7 is turned on when a scan signal having the gate-on voltage is supplied to the (i+1)th scan line Si+1, to supply the voltage of the initialization power source Vint to the one end portion of the light emitting devices LD.

The storage capacitor Cst is connected between the first pixel power source VDD and the first node N1. The storage capacitor Cst stores a voltage corresponding to the data signal supplied to the first node N1 in each frame period and a threshold voltage of the transistor T1.

Although FIG. 3 illustrates that all the transistors, e.g., the first to seventh transistors T1 to T7 included in the pixel circuit PXC are implemented with a P-type transistor, the present disclosure is not limited thereto. In an example, at least one of the first to seventh transistors T1 to T7 may be implemented with an N-type transistor.

Figure 4:
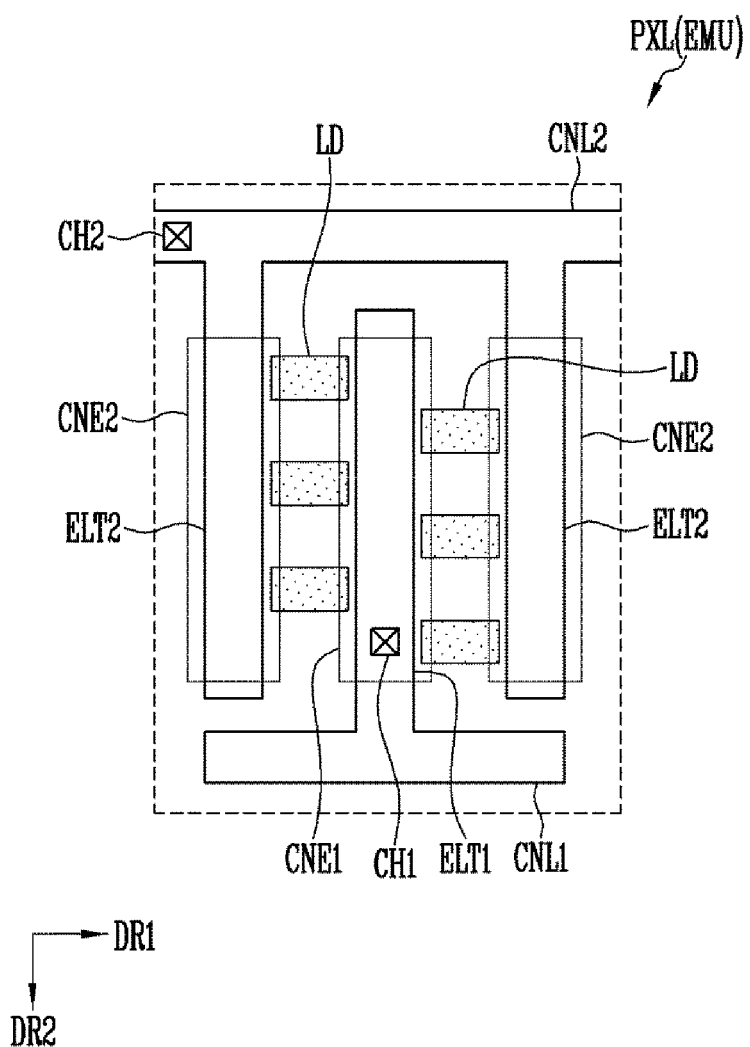
FIG. 4 is a plan view illustrating a structure of a pixel according to an embodiment of the present disclosure.

FIG. 4 is a plan view illustrating a structure of a pixel PXL according to an embodiment of the present disclosure. In particular, FIG. 4 is a plan view illustrating an embodiment of a layout of a light emitting unit EMU disposed in a display element layer of each pixel PXL. For convenience, FIG. 4 illustrates that all light emitting devices LD are arranged in a first direction DR1, e.g., a horizontal direction, but the direction in which the light emitting devices LD are arranged is not limited thereto. For example, at least one of the light emitting devices LD may not be aligned in an oblique direction. In FIG. 4, the structure of the light emitting unit EMU is simply illustrated, such as a case in which each electrode is provided as a single electrode layer. However, the present disclosure is not limited thereto. In an example, at least one of electrodes shown in FIG. 4 may be configured in a multi-layered structure. In some embodiments, it will be apparent that at least one conductive layer (not shown) and/or at least one insulating layer (not shown) may be further disposed in the light emitting unit EMU.

In some embodiments, the light emitting unit EMU of FIG. 4 may constitute the light source of the pixel PXL shown in FIGS. 2 and 3. In addition, the light emitting unit EMU of FIG. 4 may constitute a light source for any of various light emitting display devices. Herein, for convenience, a structure of the light emitting unit EMU according to this embodiment will be described with reference to FIG. 4 in conjunction with FIG. 3.

Referring to FIGS. 3 and 4, each light emitting unit EMU may include a first pixel electrode ELT1, a second pixel electrode ELT2, and a plurality of light emitting devices LD connected between the first and second pixel electrodes ELT1 and ELT2. However, the present disclosure is not limited to the embodiment shown in FIGS. 3 and 4. For example, at least one light emitting unit EMU may include only a single light emitting device LD. In some embodiments, each light emitting unit EMU may be disposed in a pixel region for forming each pixel PXL, and be surrounded by a partition wall, a dam structure or the like, which is not shown.

In some embodiments, the first pixel electrode ELT1 and the second pixel electrode ELT2 are disposed to be spaced apart from each other, and may be disposed such that at least one region of the first pixel electrode ELT1 and at least one region of the second pixel electrode ELT2 are opposite to each other. In an example, the first pixel electrode ELT1 and the second pixel electrode ELT2 may be disposed side by side in a same layer to be spaced apart from each other at a distance (e.g., a predetermined distance). However, the present disclosure is not limited thereto. For example, the shape of the first and second pixel electrodes ELT1 and ELT2 and/or the mutual arrangement relationship between the first and second pixel electrodes ELT1 and ELT2 may be variously modified.

In some embodiments, the first pixel electrode ELT1 may be connected to a pixel circuit of a corresponding pixel, e.g., the pixel circuit PXC shown in FIG. 3. For example, the first pixel electrode ELT1 may be connected to the pixel circuit PXC through a first contact hole CH1. In some embodiments, each pixel circuit PXC may be located on the bottom of light emitting devices LD arranged in a corresponding pixel region. For example, each pixel circuit PXC may be formed in a pixel circuit layer on the bottom of the light emitting devices LD.

In some embodiments, the first pixel electrode ELT1 and a first connection electrode CNL1 may extend in different directions in each pixel region. In an example, the first connection electrode CNL1 may extend along the first direction DR1, and the first pixel electrode ELT1 may extend along a second direction DR2 intersecting the first direction DR1.

In some embodiments, the first pixel electrode ELT1 and the first connection electrode CNL1 may be integrally connected to each other. For example, the first pixel electrode ELT1 may be formed to branch off into at least one part from the first connection electrode CNL1. However, the present disclosure is not limited thereto. For example, in another embodiment, the first pixel electrode ELT1 and the first connection electrode CNL1 may be individually formed, to be electrically connected to each other through at least one contact hole, via hole, or the like, which is not shown.

In some embodiments, the second pixel electrode ELT2 may be connected to the second pixel power source VSS. For example, the second pixel electrode ELT2 may be connected to the second pixel power source VSS via a second connection electrode CNL2, a second contact hole CH2, and a second pixel power line (not shown). In some embodiments, one region of the second pixel power line for supplying the second pixel power source VSS may be disposed in the pixel circuit layer on the bottom of the light emitting devices LD, but the present disclosure is not limited thereto.

In some embodiments, the second pixel electrode ELT2 and the second connection electrode CNL2 may extend along different directions in each pixel region. In an example, the second connection electrode CNL2 may extend along the first direction DR1, and the second pixel electrode ELT2 may extend along the second direction DR2 intersecting the first direction DR1.

In some embodiments, the second pixel electrode ELT2 and the second connection electrode CNL2 may be integrally connected to each other. For example, the second pixel electrode ELT2 may be formed to branch off into at least one part, e.g., a plurality of parts, from the second connection electrode CNL2. However, the present disclosure is not limited thereto. For example, in another embodiment, the second pixel electrode ELT2 and the second connection electrode CNL2 may be individually formed, to be electrically connected to each other through at least one contact hole, via hole, or the like, which is not shown.

In some embodiments, a plurality of light emitting devices LD may be arranged between the first pixel electrode ELT1 and the second pixel electrode ELT2. In an example, the plurality of light emitting devices LD may be connected in parallel in a region in which the first pixel electrode ELT1 and the second pixel electrode ELT2 are disposed to face each other.

The light emitting devices LD are electrically connected between the first and second pixel electrodes ELT1 and ELT2 of each pixel PXL. For example, one end portion of the light emitting devices LD may be electrically connected to the first pixel electrode ELT1 of the corresponding pixel PXL, and the other end portions of the light emitting devices LD may be electrically connected to the second pixel electrode ELT2 of the corresponding pixel PXL.

In an embodiment, the one end portion of the light emitting devices LD are not directly disposed on the first pixel electrode ELT1, but may be electrically connected to the first pixel electrode ELT1 through at least one contact electrode, e.g., a first contact electrode CNE1. However, the present disclosure is not limited thereto. For example, in another embodiment, the one end portion of the light emitting devices LD may be in direct contact with the first pixel electrode ELT1, to be electrically connected to the first pixel electrode ELT1.

Similarly, in an embodiment, the other end portions of the light emitting devices LD are not directly disposed on the second pixel electrode ELT2, but may be electrically connected to the second pixel electrode ELT2 through at least one contact electrode, e.g., a second contact electrode CNE2. However, the present disclosure is not limited thereto. For example, in another embodiment, the other end portions of the light emitting devices LD may be in direct contact with the second pixel electrode ELT2, to be electrically connected to the second pixel electrode ELT2.

In some embodiments, each of the light emitting devices LD may be a micro light emitting diode having a size small to a degree of nano or micro scale, using a material having an inorganic crystalline structure. For example, each light emitting device LD may be a micro bar type light emitting diode as shown in FIG. 1. In some embodiments, the light emitting devices LD may be prepared in a form in which they are dispersed in a solution (e.g., a predetermined solution), to be supplied to the light emitting unit EMU of each pixel PXL, using an inkjet technique. In an example, the light emitting devices LD may be mixed in a volatile solvent and then dropped onto each light emitting unit EMU. When a voltage (e.g., a predetermined voltage) is supplied to each of the first and second pixel electrodes ELT1 and ELT2, an electric field is formed between the first and second pixel electrodes ELT1 and ELT2, such that the light emitting devices LD are self-aligned between the first and second pixel electrodes ELT1 and ELT2. After the light emitting devices LD are aligned, the solvent is volatilized or removed using another technique except the volatilization, such that the light emitting devices LD can be stably disposed between the first and second pixel electrodes ELT1 and ELT2. Further, the first contact electrode CNE1 and the second contact electrode CNE2 are respectively formed at both end portions of the light emitting devices LD, such that the light emitting devices LD can be stably connected between the first and second pixel electrodes ELT1 and ELT2.

In some embodiments, the first contact electrode CNE1 may be formed to cover the one end portion of the light emitting devices LD and at least one region of the first pixel electrode ELT1, such that the one end portion of the light emitting devices LD and the first pixel electrode ELT1 can be physically and/or electrically connected to each other. Similarly, the second contact electrode CNE2 may be formed to cover the other end portions of the light emitting devices LD and at least one region of the second pixel electrode ELT2, such that the other end portions of the light emitting devices LD and the second pixel electrode ELT2 can be physically and/or electrically connected to each other.

The plurality of light emitting devices LD disposed in the light emitting unit EMU of each pixel PXL may constitute a light source of the corresponding pixel PXL. In an example, when a driving current is supplied to a light emitting unit EMU of at least one pixel PXL during each frame period, light emitting devices LD connected in a forward direction between the first and second pixel electrodes ELT1 and ELT2 of the pixel PXL may emit light with a luminance corresponding to the driving current.

FIGS. 5A to 5E are plan views illustrating an arrangement method of light emitting devices LD, and a light emitting display panel 110 fabricated through the arrangement method according to an embodiment of the present disclosure. In some embodiments, FIGS. 5A to 5E illustrate an embodiment in which, after a plurality of light emitting display panels 110 are concurrently (e.g., simultaneously) formed on one mother substrate 100, the light emitting display panels 110 are individually separated through a cutting process.

First, referring to FIGS. 1 to 5A, the mother substrate 100 may include a plurality of cell regions 110A for forming a plurality of light emitting display panels 110. The mother substrate 100 is used to concurrently (e.g., simultaneously) fabricate a plurality of light emitting display panels 110 on a large-sized substrate SUB, and may include a substrate SUB that becomes a base member for the plurality of light emitting display panels 110, and electrodes, lines, and/or circuit elements, which are formed on the substrate SUB.

Each cell region 110A of the substrate SUB may include a display region including a plurality of pixel regions PXA and a non-display region NDA disposed at a periphery of the display region DA. Each pixel region PXA may be a region in which each pixel PXL is formed. Each cell region 110A is a region in which each light emitting display panel 110 is formed and, in an embodiment, may be defined by a scribing line SCL.

First and second pixel electrodes ELT1 and ELT2 may be formed in the display region DA of each cell region 110A. In some embodiments, each first pixel electrode ELT1 may be electrically connected to a first alignment line AL1 through each first connection electrode CNL1, and each second pixel electrode ELT2 may be electrically connected to a second alignment line AL2 through each second connection line CNL2. In some embodiments, in a process before an alignment process of light emitting devices LD is completed, the first and second pixel electrodes ELT1 and ELT2 formed in each cell region 110A may be commonly connected to the first and second alignment lines AL1 and AL2, respectively.

In some embodiments, a pixel circuit layer including a plurality of circuit elements may be disposed on the bottom of the first and second pixel electrodes ELT1 and ELT2. In an example, a pixel circuit layer including various circuit elements constituting the pixel circuit PXC of FIG. 3 and/or various lines connected thereto may be disposed between the substrate SUB and a layer in which the first and second pixel electrodes ELT1 and ELT2 are disposed.

The first and second alignment lines AL1 and AL2 may be disposed in the non-display region NDA of each cell region 110A. For example, in each cell region 110A, the first and second alignment lines AL1 and AL2 may be disposed to face different end portions of the substrate SUB with the substrate SUB interposed therebetween. In an example, in each cell region 110A, the first alignment line AL1 may be disposed in the non-display region at the left of the display region DA, and the second alignment line AL2 may be disposed in the non-display region NDA at the right of the display region DA.

In some embodiments, each first alignment line AL1 may be commonly connected to first pixel electrodes ELT1 formed in a plurality of cell regions 110A, and each second alignment line AL2 may be commonly connected to second pixel electrodes ELT2 formed in the plurality of cell regions 110A. Also, each first alignment line AL1 may be connected to a predetermined first alignment pad AP1 disposed in one region (e.g., an edge region) of the mother substrate 100, and each second alignment line AL2 may be connected to a predetermined second alignment pad AP2.

In an embodiment, a plurality of cell regions 110A may be disposed along a second direction DR2 on each column of the mother substrate 100, and at least one first alignment line AL1 commonly connected to first pixel electrodes ELT1 of the cell regions 110A disposed on the corresponding column and at least one second alignment line AL2 commonly connected to second pixel electrodes ELT2 of the cell regions 110A disposed on the corresponding column may be disposed on each column of the mother substrate 100.

In an embodiment, a plurality of cell regions 110A may be disposed along a first direction DR1 on each row of the mother substrate 100, and the mother substrate 100 may include a plurality of first and second alignment lines AL1 and AL2 for respectively connecting, in units of columns, first and second pixel electrodes ELT1 and ELT2 of the cell regions 110A to predetermined first and second alignment pads AL1 and AL2. However, the present disclosure is not limited thereto. For example, in another embodiment, although a plurality of cell regions 110A is disposed on each column and each row of the mother substrate 100, all first pixel electrodes ELT1 formed on the mother substrate 100 may be commonly connected to one first alignment pad AP1 through one first alignment line AL1, or all second pixel electrodes ELT2 formed on the mother substrate 100 may be commonly connected to one second alignment pad AP2 through one second alignment line AL2. In still another embodiment, the mother substrate 100 may include a plurality of cell regions 110A disposed on a single column and/or a single row and a pair of first and second alignment lines AL1 and AL2 for commonly connecting first and second pixel electrodes ELT1 and ELT2 of the cell regions 110A to a pair of first and second alignment pads AP1 and AP2.

In an embodiment of the present disclosure, each of the first and second alignment lines AL1 and AL2 may be configured in a multi-layered structure. In an example, each of the first and second alignment lines AL1 and AL2 may have a multi-layered structure including a main line (not shown) and a sub-line (not shown), which are disposed in a same layer as at least one of the first and second pixel electrodes ELT1 and ELT2. For example, the first alignment line AL1 may have a main line and a sub-line, which are electrically connected to each other through at least one third contact hole CH3, and the second alignment line AL2 may have a main line and a sub-line, which are electrically connected to each other through at least one fourth contact hole CH4. The size, shape, and/or number of third contact holes CH3 formed in the first alignment line AL1, and the size, shape, and/or number of fourth contact holes CH4 formed in the second alignment line AL2 are not particularly limited, and may be variously modified.

In some embodiments, each main line may be concurrently (e.g., simultaneously) formed with the first pixel electrode ELT1 and/or the second pixel electrode ELT2, to be disposed in a same layer as the first pixel electrode ELT1 and/or the second pixel electrode ELT2. Also, in some embodiments, each sub-line may be disposed on the bottom of a corresponding main line to overlap with the main line. In an example, each sub-line may be concurrently (e.g., simultaneously) formed with at least one electrode formed in the pixel circuit layer, to be disposed in the same layer as the at least one electrode. Various embodiments related to the multi-layered structure of each of the first and second alignment lines AL1 and AL2 will be described later.

As described above, when each of the first and second alignment lines AL1 and AL2 is formed in the multi-layered structure, the resistance of the first and second alignment lines AL1 and AL2 can be effectively decreased. Accordingly, in a subsequent process of aligning light emitting devices LD, a voltage drop occurring in each of the first and second alignment lines AL1 and AL2 can be reduced or minimized. Thus, in the process of aligning the light emitting devices LD, a desired alignment voltage can be transferred to first and second pixel electrodes ELT1 and ELT2 of each pixel PXL.

Further, when the resistance of the first and second alignment lines AL1 and AL2 is decreased by forming each of the first and second alignment lines AL1 and AL2 in the multi-layered structure, a desired alignment voltage can be uniformly transferred to the plurality of cell regions 110A disposed on the mother substrate 100. Thus, light emitting devices LD can be effectively aligned between first and second pixel electrodes ELT1 and ELT2 of each of the plurality of cell regions 110A while an alignment process of light emitting devices LD is being concurrently (e.g., simultaneously) performed on the plurality of cell regions 110A on the mother substrate 100. Accordingly, the quality and fabrication efficiency of the light emitting display device can be improved.

Referring to FIGS. 1 to 5B, an electric field may be applied or formed in each pixel region PXA by supplying light emitting devices LD into each pixel region PXA of the mother substrate 100 and applying a voltage (e.g., a predetermined voltage) to first and second alignment pads AP1 and AP2. Accordingly, the light emitting devices LD are self-aligned between first and second pixel electrodes ELT1 and ELT2 of a corresponding pixel region PXA.

In some embodiments, an AC voltage (e.g., a predetermined AC voltage) may be applied to the first alignment pad AP1, and a ground voltage may be applied to the second alignment pad AP2. In another embodiment, the ground voltage may be applied to the first alignment pad AP1, and the AC voltage may be applied to the second alignment pad AP2.

The voltages applied to the first and second alignment pads AP1 and AP2 are transferred to the first and second pixel electrodes ELT1 and ELT2 of each pixel region PXA via the first and second alignment lines AL1 and AL2, respectively. Accordingly, when an electric field is formed between the first and second pixel electrodes ELT1 and ELT2, the light emitting devices LD supplied into each pixel region PXA are aligned between the first and second pixel electrodes ELT1 and ELT2.

In some embodiments, light emitting devices LD may be dispersed in a solution (e.g., a predetermined solution) and be supplied into each pixel region through an inkjet technique, etc. However, the technique of supplying the light emitting device LD is not limited thereto. In addition, the light emitting devices LD may be supplied into each pixel region PXA through any of various techniques.

In some embodiments, the supply and alignment processes of light emitting devices LD may be sequentially or concurrently (e.g., simultaneously) performed. In an example, light emitting devices LD may be aligned by supplying the light emitting devices LD into each pixel region PXA, and, at the same time, supplying a voltage (e.g., a predetermined voltage) to first and second pixel electrodes ELT1 and ELT2 in the corresponding pixel region PXA. In another embodiment, light emitting devices LD may be aligned by supplying the light emitting devices LD into each pixel region PXA and then supplying a voltage (e.g., a predetermined voltage) to first and second pixel electrodes ELT1 and ELT2 in the corresponding pixel region PXA. That is, in the present disclosure, the sequence of the supply and alignment processes of the light emitting devices LD and/or the method of performing the supply and alignment processes of the light emitting devices LD are not particularly limited.

Referring to FIGS. 1 to 5C, after the supply and alignment processes of the light emitting devices LD are completed, first pixel electrodes ELT1 and/or second pixel electrodes ELT2 are separated between pixel regions PXA such that each of the pixel regions PXA can be independently driven. In an example, when assuming that a first pixel electrode ELT of each pixel is connected to a pixel circuit of the corresponding pixel PXL, connections between first pixel electrodes ELT1 connected to each other between pixel regions PXA are cut, such that the first pixel electrodes ELT1 can be separated for each pixel PXL. A first alignment line AL1 may be separated from pixels PXL of the display region DA.

In an embodiment, the other pixel electrodes of each pixel PXL, e.g., the second pixels ELT2, may be commonly connected to the second pixel power line. Thus, the second pixel electrodes ELT2 can be maintained in a state in which they are not separated from each other but connected to each other between the pixel regions PXA. In addition, a second alignment line AL2 may be maintained in a state in which it is connected to the pixels PXL of the display region DA. However, the present disclosure is not limited thereto. For example, in another embodiment, the second pixel electrodes ELT2 may also be separated from each other between the pixel regions PXA.

Figure 5A:
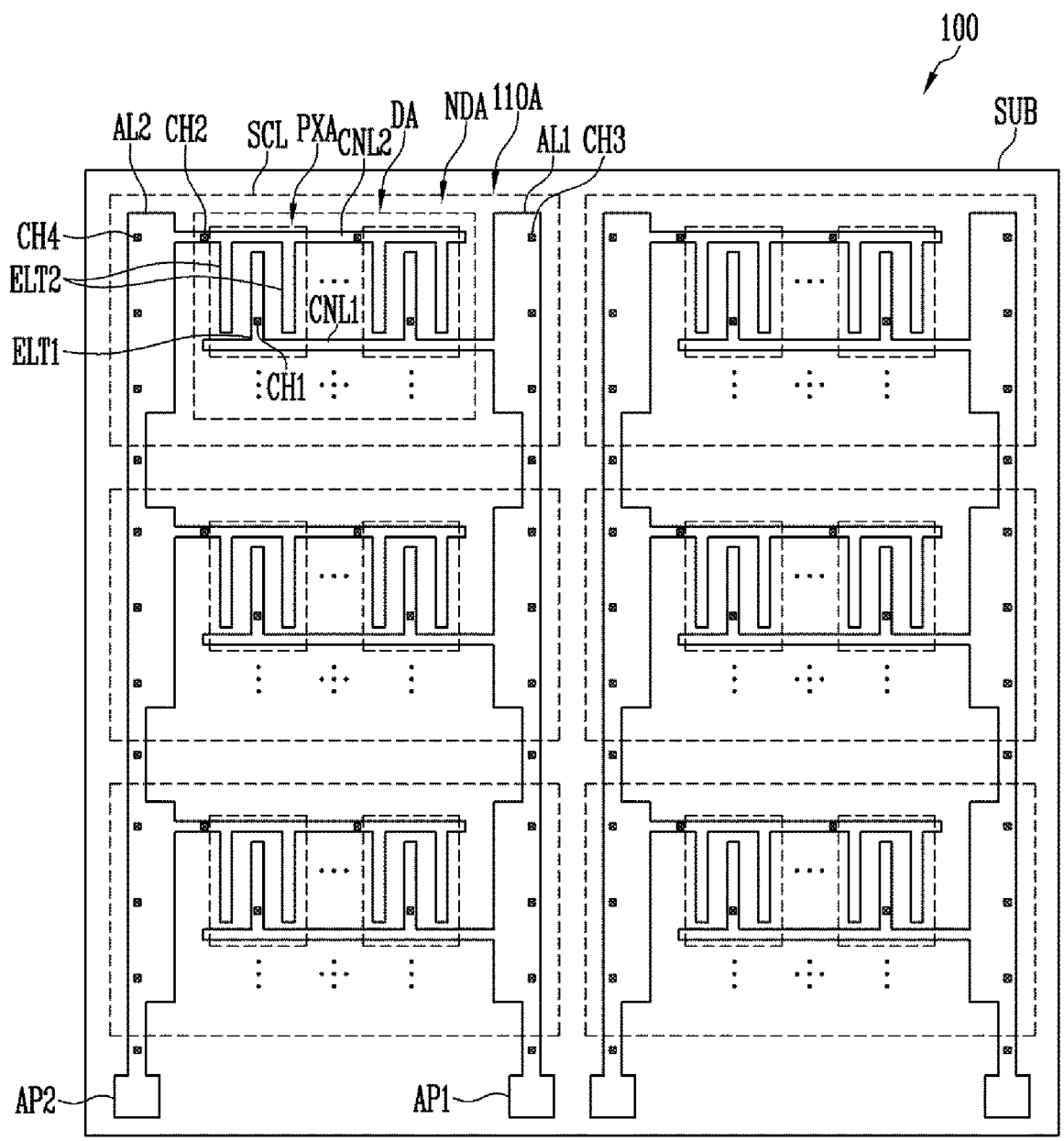
FIGS. 5A to 5E are plan views illustrating an arrangement method of light emitting devices, and a light emitting display panel fabricated through the arrangement method according to an embodiment of the present disclosure.
Figure 5B:
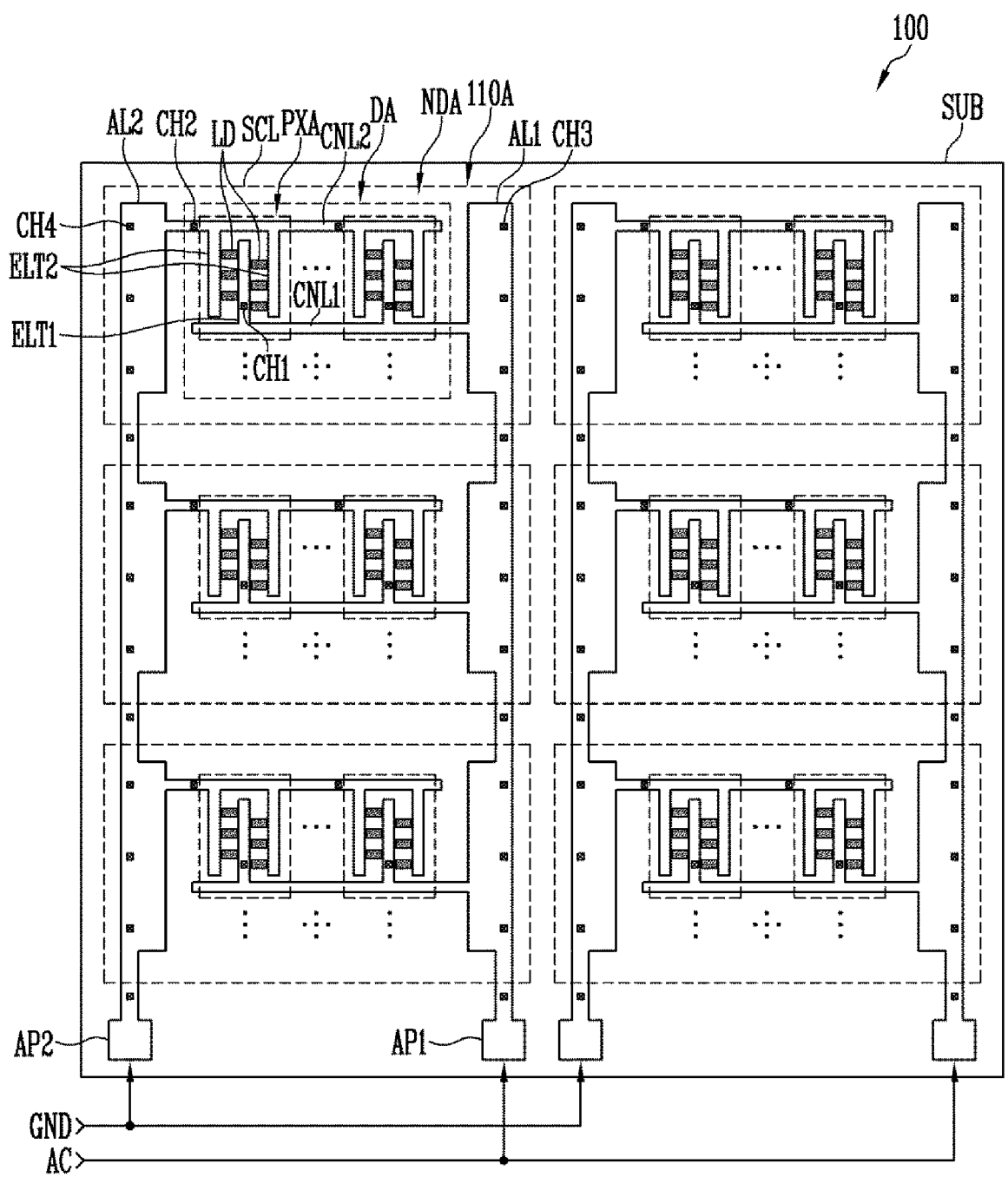
Figure 5C:
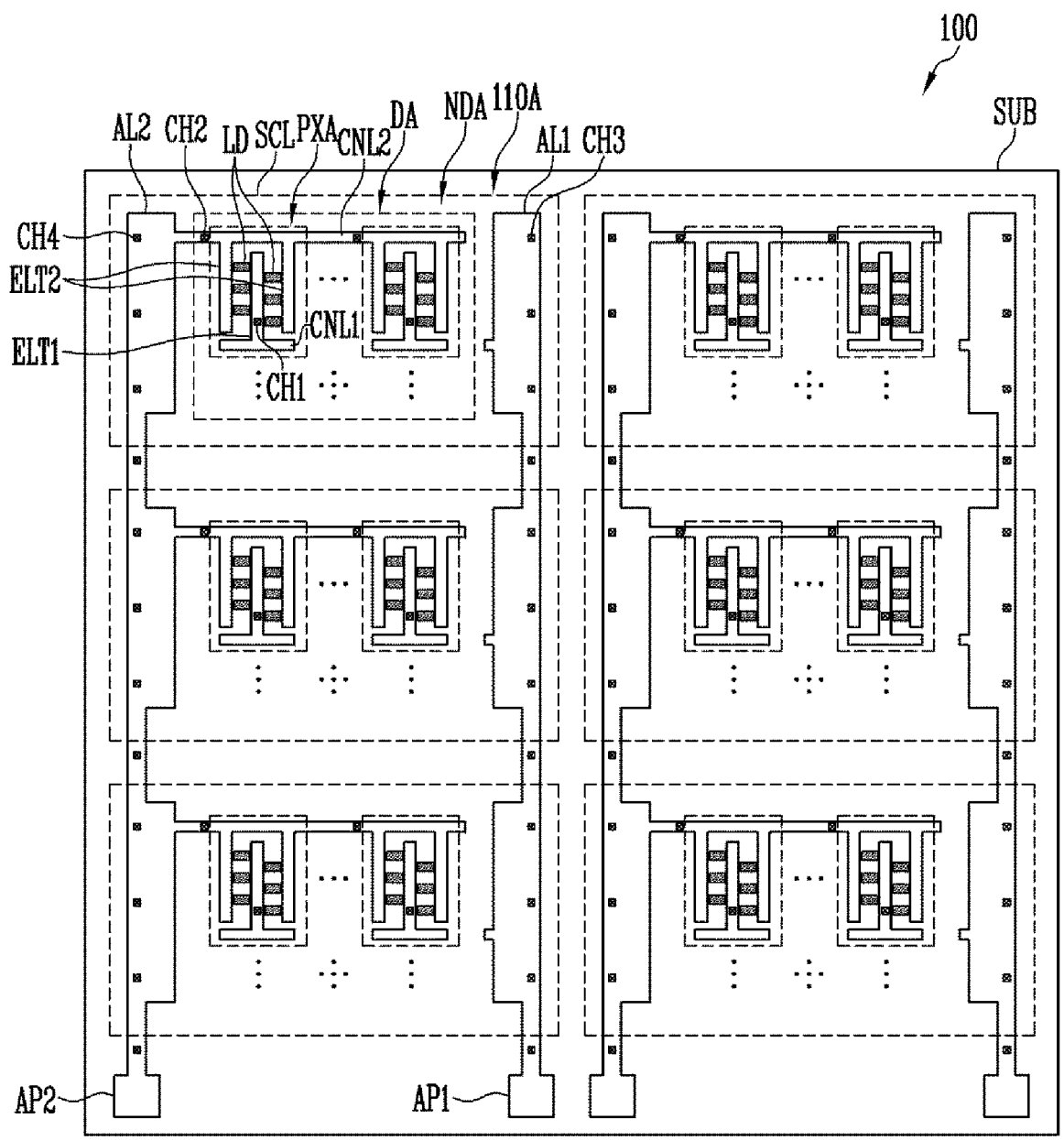
Figure 5D:
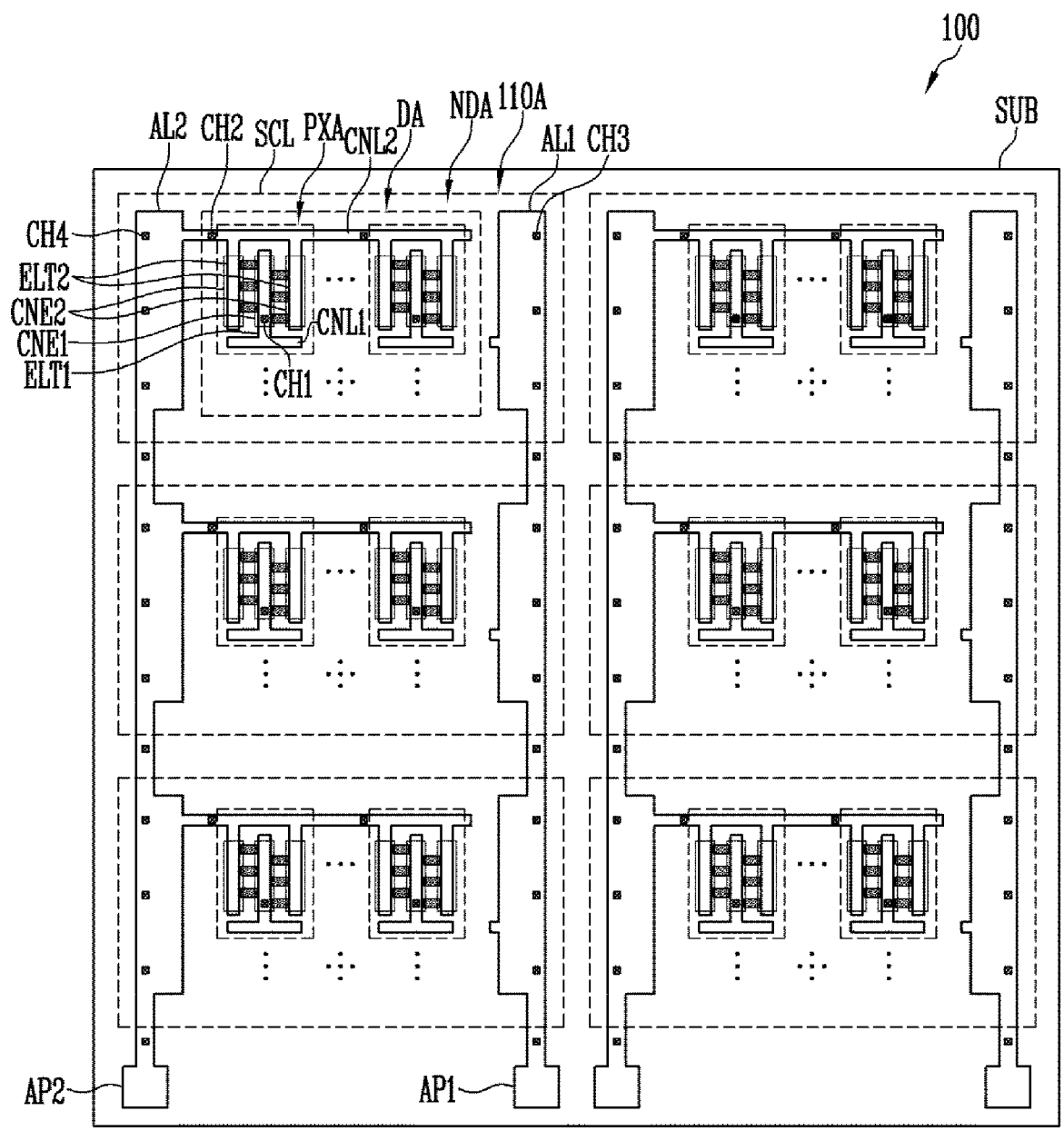

Referring to FIGS. 1 to 5D, first and second contact electrodes CNE1 and CNE2 are respectively formed at both ends of light emitting devices LD, such that both ends of the light emitting devices LD may be physically and/or electrically connected to first and second pixel electrodes ELT1 and ELT2, respectively. In this embodiment, after the first pixel electrodes ELT1 and/or the second pixel electrodes ELT2 are separated between the pixel regions PXA as shown in FIG. 5C, the first and second contact electrodes CNE1 and CNE2 are formed in each pixel region PXA as shown in FIG. 5D. However, the present disclosure is not limited thereto. For example, the separation process of the first pixel electrodes ELT1 and/or the second pixel electrodes ELT2 shown in FIG. 5C and a formation process of the first and second contact electrodes CNE1 and CNE2 shown in FIG. 5D may be performed in the reverse sequence. In an embodiment, after the first and second contact electrode CNE1 and CNE2 are first formed, the first pixel electrodes ELT1 may be separated from each other between the pixel regions PXA as shown in FIG. 5C.

Referring to FIGS. 1 to 5E, in an embodiment, after the formation of a display element layer including a plurality of light emitting device LD and the formation of a protective layer (not shown) for protecting the display element layer are completed, a cutting process along a scribing line SCL is performed. Accordingly, the cell regions 110A disposed on the mother substrate 100 may be individually separated, such that each light emitting display panel 110 can be fabricated.

When the light emitting display panels 110 formed on the one mother substrate 100 are separated from each other, at least one end of each of the first and second alignment lines AL1 and AL2 may remain in a disconnected state. The first and second alignment lines AL1 and AL2 may remain in the form of an outer line unit OLU disposed at an outer portion of the substrate SUB on an individual light emitting display panel 110.

Figure 5E:
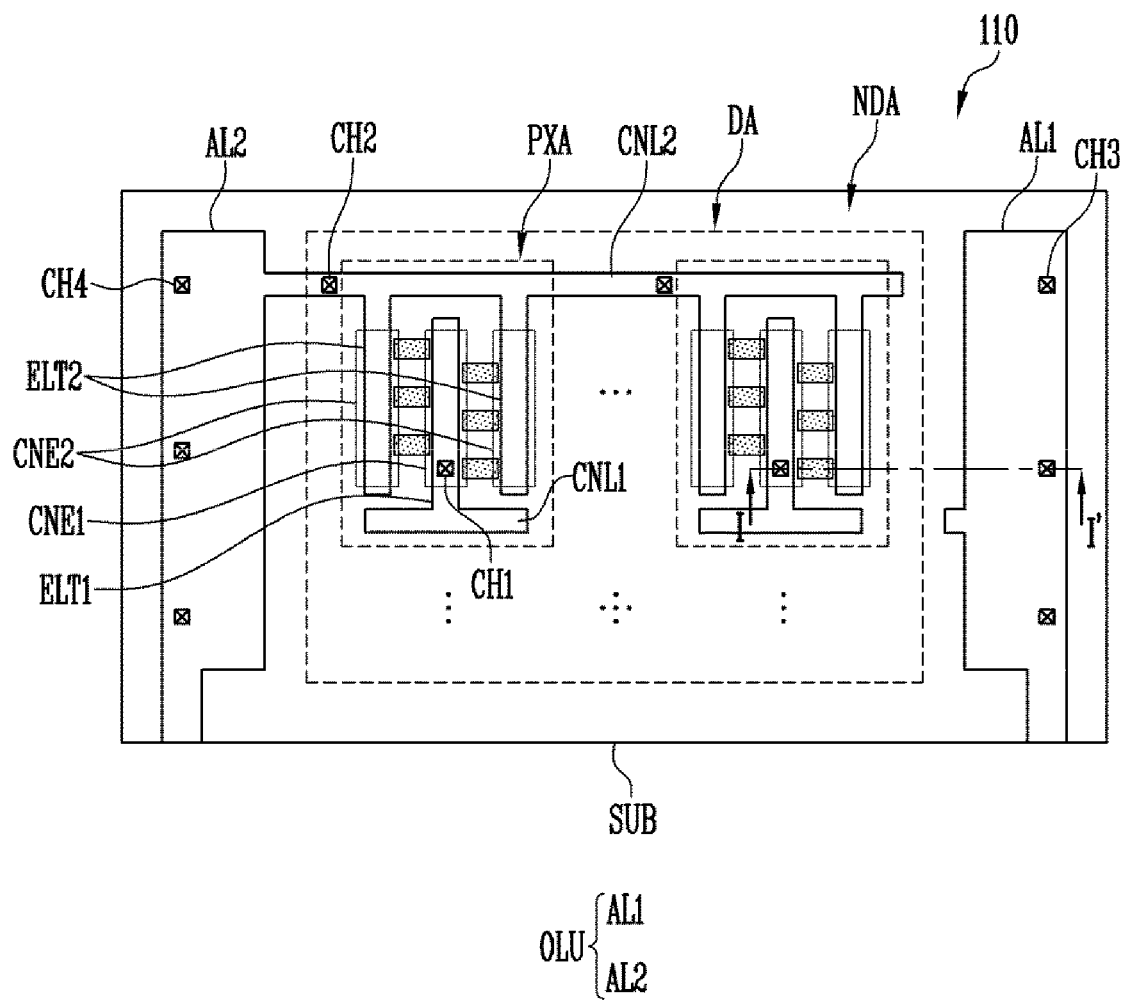

FIGS. 6 to 20 are cross-sectional views illustrating a structure of a light emitting display device according to various embodiments of the present disclosure, which illustrate a section corresponding to the line I-I' of the light emitting display panel 110 shown in FIG. 5E.

First, referring to FIGS. 1 to 6, a pixel circuit layer PCL and a display element layer LDL are sequentially disposed in a display region DA on a substrate SUB. For example, a pixel circuit layer PCL may be formed on a surface of the substrate SUB, and the display element layer LDL may be formed on the surface of the substrate SUB on which the pixel circuit layer PCL is formed.

In some embodiments, the pixel circuit layer PCL includes a plurality of circuit elements disposed in the display region DA. For example, the pixel circuit layer PCL may include a plurality of pixel elements formed in each pixel region PXA to constitute each pixel circuit PXC. In an example, the pixel circuit layer PCL may include at least one transistor T and a storage capacitor Cst, which are disposed in each pixel region PXA.

Figure 6:
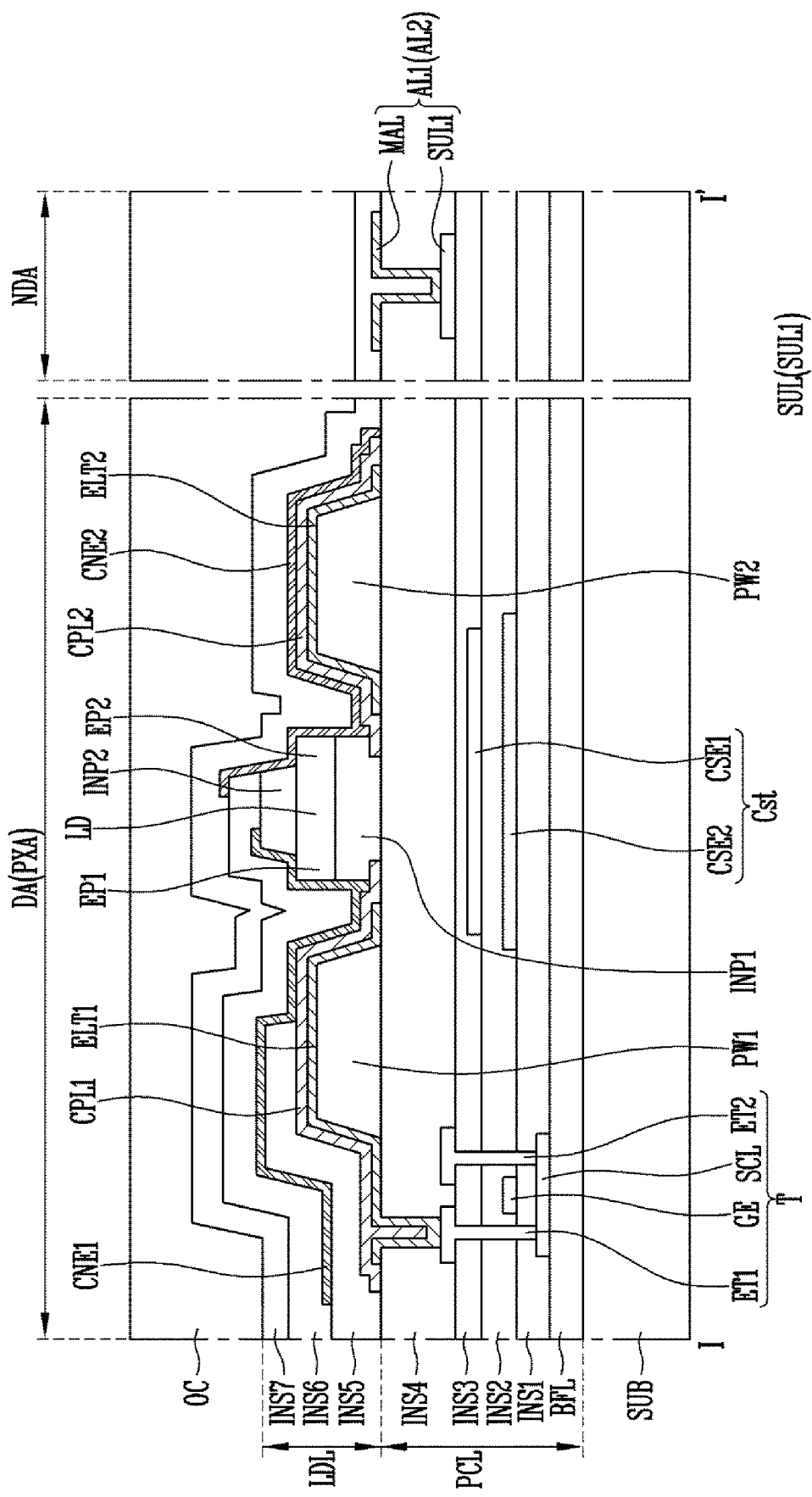
FIGS. 6 to 20 are cross-sectional views illustrating a structure of a light emitting display device according to various embodiments of the present disclosure, which illustrate a section corresponding to the line I-I' of the light emitting display panel shown in FIG. 5E.

For convenience, although FIG. 6 illustrates only one transistor T connected to a light emitting device LD of a corresponding pixel PXL through each first pixel electrode ELT1, e.g., the sixth transistor T6 of FIG. 3, transistors constituting each pixel circuit PXC, e.g., the first to seventh transistors T1 to T7 of FIG. 3, may have cross-sectional structures substantially the same or similar to one another. For example, each transistor T may have any of various cross-sectional structures currently known in the art. In another embodiment of the present disclosure, the plurality of transistors constituting each pixel circuit PXC may have different types and/or different structures.

In an embodiment, the pixel circuit layer PCL includes a plurality of insulating layers. In an example, the pixel circuit layer PCL may include first, second, third, and fourth insulating layers INS1, INS2, INS3, and INS4 sequentially stacked on the surface of the substrate SUB. In some embodiments, the first, second, third, and fourth insulating layers INS1, INS2, INS3, and INS4 may be sequentially stacked between the substrate SUB and the display element layer LDL. In an embodiment, the pixel circuit layer PCL may additionally include at least one buffer layer BFL disposed between the substrate SUB and the circuit elements. In some embodiments, at least one of the first to fourth insulating layers INS1, INS2, INS3, and INS4 and the buffer layer BFL may be formed on the surface of the substrate SUB including the display region DA and a non-display region NDA.

In some embodiments, the buffer layer BFL may prevent or substantially prevent an impurity from being diffused into each transistor T. In an embodiment, the buffer layer may be provided in a single layer, but may be provided in a multi-layer including at least two layers. When the buffer layer BFL is provided in the multi-layer, the layers may be formed of a same material or different materials. However, the buffer layer BFL may be omitted in some embodiments.

In some embodiments, each transistor T includes a semiconductor layer SCL, a gate electrode GE, a first electrode ET1, and a second electrode ET2. An embodiment in which each transistor T includes a first electrode ET1 and a second electrode ET2, which are separately formed with a semiconductor layer SCL, is illustrated in FIG. 6, but the present disclosure is not limited thereto. For example, in another embodiment, at least one transistor T disposed in each pixel region PXA includes a separate first electrode ET1 and/or a separate second electrode ET2, but the first electrode ET1 and/or the second electrode ET2 may be integrated with each semiconductor layer SCL.

The semiconductor layer SCL may be disposed on the buffer layer BFL. In an example, the semiconductor layer SCL may be disposed between the substrate SUB on which the buffer layer BFL is formed and the first insulating layer INS1. The semiconductor layer SCL may include a first region in contact with the first electrode ET1, a second region in contact with the second electrode ET2, and a channel region located between the first and second regions. In some embodiments, one of the first and second regions may be a source region, and the other of the first and second regions may be a drain region.

In some embodiments, the semiconductor layer SCL may be a semiconductor pattern made of poly-silicon, amorphous silicon, oxide semiconductor, etc. The channel region of the semiconductor layer SCL is a semiconductor pattern undoped with an impurity, and may be an intrinsic semiconductor. Each of the first and second regions of the semiconductor layer SCL may be a semiconductor pattern doped with a predetermined impurity.

The gate electrode GE may be disposed on the semiconductor layer SCL with the first insulating layer INS1 interposed therebetween. In an example, the gate electrode GE may be disposed between the first and second insulating layers INS1 and INS2, and overlap with at least one region of the semiconductor layer SCL.

The first and second electrodes ET1 and ET2 may be disposed on the semiconductor layer SCL with at least one insulating layer, e.g., a plurality of insulating layers, interposed therebetween. For example, the first and second electrodes ET1 and ET2 may be disposed between the third and fourth insulating layers INS3 and INS4. The first and second electrodes ET1 and ET2 may be electrically connected to the semiconductor layer SCL. For example, the first and second electrodes ET1 and ET2 may be in contact with the first and second regions of the semiconductor layer SCL through contact holes penetrating the first to third insulating layers INS1 to INS3, respectively.

In some embodiments, any one of the first and second electrodes ET1 and ET2 may be electrically connected to the first pixel electrode ELT1 disposed on the top of the fourth insulating layer INS4 by at least one contact hole penetrating the fourth insulating layer INS4. However, this may be changed for each transistor depending on the connection position of each transistor T.

In some embodiments, the storage capacitor Cst may include first and second capacitor electrodes CSE1 and CSE2 disposed in different layers to be spaced apart from each other. In an example, the first capacitor electrode CSE1 may be disposed between the second and third insulating layers INS2 and INS3. In an embodiment, the second capacitor electrode CSE2 may be disposed in a same layer as at least one conductive layer constituting the transistor T, e.g., at least one of the semiconductor layer SCL, the gate electrode GE, and the first and second electrodes ET1 and ET2. In an example, the second capacitor electrode CSE2 may be disposed together with the gate electrode GE of the transistor T between the first and second insulating layers INS1 and INS2.

For convenience, a case in which each of the first and second capacitor electrodes CSE1 and CSE2 is provided in a single layer is illustrated in FIG. 6, but the present disclosure is not limited thereto. For example, at least one of the first and second capacitor electrodes CSE1 and CSE2 may be provided in a multi-layer, and the stack structure and/or positions of the first and second capacitor electrodes CSE1 and CSE2 may be variously modified.

In some embodiments, the display element layer LDL may include a plurality of light emitting devices LD disposed in the display region DA on the pixel circuit layer PCL. For example, the display element layer LDL may include a plurality of light emitting devices LD formed on the top of the pixel circuit layer PCL in each pixel region PXA to constitute each light emitting unit EMU.

For convenience, only one light emitting device LE is illustrated in FIG. 6. However, in some embodiments, a plurality of light emitting devices LD may be disposed in each pixel region PXA. In each pixel region PXA, the light emitting devices LD may be substantially disposed in a same layer, to have cross-sectional structures and/or connection structures, which are the same or similar to one another. In the present disclosure, the structure and position of each light emitting device LD are not limited to the embodiment shown in FIG. 6. For example, each light emitting device LD may have any of various cross-sectional structures and/or various connection structures, which are currently known in the art.

In some embodiments, the display element layer LDL may include first and second pixel electrodes ELT1 and ELT2 disposed in each pixel region PXA, light emitting devices LD disposed between first and second pixel electrodes ELT1 and ELT2 corresponding to each other, and first and second contact electrodes CNE1 and CNE2 disposed on first and second end portions EP1 and EP2 of each of the light emitting devices LD. In addition, the display element layer LDL may additionally include at least one conductive layer and/or at least one insulating layer. In an example, the display element layer LDL may further include first and second partition walls PW1 and PW2, first and second capping layers CPL1 and CPL2, and at least one of fifth to seventh insulating layers INS5 to INS7.

In some embodiments, the first and second partition walls PW1 and PW2 may be disposed on the fourth insulating layer INS4 of the pixel circuit layer PCL. The first and second partition walls PW1 and PW2 may also be referred to as a first bank and a second bank, respectively.

In an example, the first and second partition walls PW1 and PW2 may be disposed on the fourth insulating layer INS4 to be spaced apart from each other at a distance (e.g., a predetermined distance). The first and second partition walls PW1 and PW2 may define a light emitting region in each pixel region PXA.

In some embodiments, the first and second partition walls PW1 and PW2 may be made of an insulating material including an inorganic material or an organic material, but the material constituting the first and second partition walls PW1 and PW2 is not limited. In an embodiment, each of the first and second partition walls PW1 and PW2 may have a trapezoidal shape of which side surfaces are inclined at an angle (e.g., a predetermined angle), but the shape of the first and second partition walls PW1 and PW2 is not limited thereto. For example, each of the first and second partition walls PW1 and PW2 may have any of various shapes, such as a semi-elliptical shape, a circular shape, and a quadrangular shape.

In some embodiments, first and second pixel electrodes ELT1 and ELT2 and first and second connection electrodes CNL1 and CNL2 may be disposed on the pixel region PXA in which the first and second partition walls WP1 and WP2, and the like are provided. In an example, the first and second pixel electrodes ELT1 and ELT2 may be disposed on the substrate on which the first and second partition walls WP1 and WP2 are formed to be spaced apart from each other at a distance (e.g., a predetermined distance). In an embodiment, the first and second connection electrodes CNL1 and CNL2 may be integrally connected to the first and second pixel electrodes ELT1 and ELT2, respectively.

In some embodiments, the first pixel electrodes ELT1 may be disposed on each first partition wall PW1, and the second pixel electrodes ELT2 may be disposed on each second partition wall PW2. In some embodiments, any one of the first and second pixel electrodes ELT1 and ELT2 may be an anode electrode, and the other of the first and second pixel electrodes ELT1 and ELT2 may be a cathode electrode.

The first and second pixel electrodes ELT1 and ELT2 may have shapes corresponding to those of the first and second partition walls PW1 and PW2, respectively. In an example, the first pixel electrode ELT1 may have a slope corresponding to a gradient of each first partition wall PW1, and the second electrode ELT2 may have a slope corresponding to a gradient of each second partition wall PW2.

In an embodiment, the first and second pixel electrodes ELT1 and ELT2 may be disposed on a same plane, and may have a same height. Thus, when the first and second pixel electrodes ELT1 and ELT2 have the same height, the light emitting devices LD can be stably connected between the first and second pixel electrodes ELT1 and ELT2. However, the present disclosure is not limited thereto, and a shape of the first and second pixel electrodes ELT1 and ELT2 and/or a mutual arrangement relationship between the first and second pixel electrodes ELT1 and ELT2 may be variously modified.

In some embodiments, each of the first and second pixel electrodes ELT1 and ELT2 may be configured as a reflective electrode, but the present disclosure is not limited thereto. For example, each of the first and second pixel electrodes ELT1 and ELT2 may be made of a conductive material having a constant reflectivity. The conductive material may include a metal, such as Ag, Mg, Al, Pt, Pd, Au, Ni, Nd, Ir, Cr, or any alloy thereof, a conductive oxide, such as indium tin oxide (ITO), indium zinc oxide (IZO), zinc oxide (ZnO), or indium tin zinc oxide (ITZO), a conductive polymer, such as PEDOT, and the like. However, the present disclosure is not limited thereto. Also, each of the first and second pixel electrodes ELT1 and ELT2 may be provided in a single layer or a multi-layer, and a stack structure of each of the first and second pixel electrodes ELT1 and ELT2 is not particularly limited.

The first and second pixel electrodes ELT1 and ELT2 may allow lights emitted from both end portions EP1 and EP2 of each of the light emitting devices LD to advance in a direction (e.g., a front direction) in which an image is displayed. In particular, when the first and second pixel electrodes ELT1 and ELT2 respectively have slopes corresponding to the shapes of the first and second partition walls WP1 and WP2, the lights emitted from both the end portions EP1 and EP2 of each of the light emitting devices LD are reflected by the first and second pixel electrodes ELT1 and ELT2, to further advance in the front direction. Accordingly, the efficiency of lights emitted from the light emitting devices LD can be improved.

In an embodiment of the present disclosure, the first and second partition walls PW1 and PW2 may also serve as reflective members. In an example, the first and second partition walls PW1 and PW2 along with the first and second pixel electrodes ELT1 and ELT2 provided on the top thereof may serve as reflective members for improving the efficiency of light emitted from each of the light emitting devices LD.

In some embodiments, first and second capping layers CPL1 and CPL2 may be disposed on the pixel region PXA in which the first and second pixel electrodes ELT1 and ELT2, and the like are provided. In an example, the first capping layers CPL1 may be disposed on the first pixel electrode ELT1 to cover the respective first pixel electrodes ELT1, and the second capping layers CPL2 may be disposed on the second pixel electrode ELT2 to cover the respective second pixel electrodes ELT2.

In some embodiments, the first and second capping layers CPL1 and CPL2 may be made of a transparent conductive material, such as IZO, to minimize or reduce loss of light emitted from each of the light emitting devices LD. However, the present disclosure is not limited thereto, and the material constituting the first and second capping layers CPL1 and CPL2 may be variously modified.

The first and second capping layers CPL1 and CPL2 may prevent or substantially prevent the first and second pixel electrodes ELT1 and ELT2 from being damaged due to a defect occurring in a fabricating process of the light emitting display device, and reinforce adhesion between the first and second pixel electrodes ELT1 and ELT2 and the pixel circuit layer PCL. However, at least one of the first and second capping layers CPL1 and CPL2 may be omitted in some embodiments.

In some embodiments, first insulating patterns INP1 may be disposed on each pixel region PXA in which the first and second capping layers CPL1 and CPL2, and the like are provided. In some embodiments, the first insulating patterns INP1 may be disposed between the pixel circuit layer PCL and the respective light emitting devices LD, and cover first regions of the first and second capping layers CPL1 and CPL2. Each first insulating pattern INP1 may stably support each light emitting device LD, and prevent or substantially prevent separation of the light emitting device LD. In some embodiments, the first insulating patterns INP1 may be concurrently (e.g., simultaneously) formed with an insulating layer formed in the display element layer LDL, or may be independently formed.

In some embodiments, light emitting devices LD may be supplied and aligned on each pixel region PXA in which the first insulating patterns INP1 and the like are provided. For example, the light emitting devices LD may be self-aligned through an electric field formed between the first and second pixel electrodes ELT1 and ELT2 of each pixel region PXA, to be disposed between the first and second pixel electrodes ELT1 and ELT2.

In some embodiments, second insulating patterns INP2 covering a portion of an upper surface of each of light emitting devices LD may be disposed on each pixel region PXA in which the light emitting devices LD are provided. In some embodiments, the second insulating patterns INP2 may be concurrently (e.g., simultaneously) formed with an insulating layer formed in the display element layer LDL, or may be independently formed.

In an embodiment, a fifth insulating layer INS5 may be formed at a portion of an upper surface of each of the first capping layers CPL1. In some embodiments, the fifth insulating layer INS5 may be concurrently (e.g., simultaneously) formed with one of the first and second insulating patterns INP1 and INP2 in a process of forming the insulating pattern, or may be independently formed. In some embodiments, the fifth insulating layer INS5 may be omitted.

In some embodiments, first contact electrodes CNE1 may be disposed on each pixel region PXA in which the second insulating patterns INP2, the fifth insulating layer INS5, and the like are provided. In some embodiments, the first contact electrodes CNE1 may cover the respective first capping layers CPL1, and be electrically connected to the first pixel electrodes ELT1 through the respective first capping layers CPL1. In some embodiments, when the first capping layers CPL1 are omitted, the first contact electrodes CNE1 may be provided directly on the respective first pixel electrodes ELT1, to be connected directly to the respective first pixel electrodes ELT1. Also, each of the first contact electrodes CNE1 may cover a first end portion EP1 of at least one light emitting device LD disposed in a corresponding pixel region PXA, and connect the first end portion EP1 of the at least one light emitting device LD to each first pixel electrode ELT1.

In some embodiments, a sixth insulating layer INS6 may be disposed on each pixel region PXA in which the first contact electrodes CNE1 and the like are provided. In some embodiments, the sixth insulating layer INS6 may be provided to cover the first contact electrodes CNE1 and the fifth insulating layer INS5.

In some embodiments, second contact electrodes CNE2 may be disposed on each pixel region PXA in which the sixth insulating layer INS6 and the like are provided. In some embodiments, the second contact electrodes CNE1 may cover the respective second capping layers CPL2, and be electrically connected to the second pixel electrodes ELT2 through the respective second capping layers CPL2. In some embodiments, when the second capping layers CPL2 are omitted, the second contact electrodes CNE2 may be provided directly on the respective second pixel electrodes ELT2, to be connected directly to the respective second pixel electrodes ELT2. Also, each of the second contact electrodes CNE2 may cover a second end portion EP2 of at least one light emitting device LD disposed in a corresponding pixel region PXA, and connect the second end portion EP2 of the at least one light emitting device LD to each second pixel electrode ELT2.

In some embodiments, a seventh insulating layer INS7, an overcoat layer OC, and the like may be disposed on each pixel region PXA in which the second contact electrodes CNE2 and the like are provided. In some embodiments, the seventh insulating layer INS7 may be provided on the surface of the substrate SUB including the display region DA and the non-display region NDA, and the overcoat layer OC may be provided to cover an upper surface of the seventh insulating layer INS7.

In an embodiment of the present disclosure, first and second alignment lines AL1 and AL2 may be disposed on the non-display region NDA of each cell region 110A. Each of the first and second alignment lines AL1 and AL2 may be disposed in the non-display region NDA on the substrate SUB, and have a multi-layered structure.

For convenience, in FIG. 6, an embodiment of cross-sectional structures of the first and second alignment lines AL1 and AL2 will be comprehensively illustrated through a cross-section of any one first alignment line AL1. For example, the first and second alignment lines AL1 and AL2 may have cross-sectional structures substantially the same or similar to each other.

However, the present disclosure is not limited thereto. For example, in another embodiment, each of the first and second alignment lines AL1 and AL2 may have a multi-layered structure, and the first and second alignment lines AL1 and AL2 may include conductive layers disposed in different layers. In an example, each first alignment line AL1 may have a cross-sectional structure illustrated in any embodiment among the embodiments of FIGS. 6 to 20, and each second alignment line AL2 may have a cross-sectional structure illustrated as an example of the first alignment line AL1 in another embodiment among the embodiments of FIGS. 6 to 20.

In some embodiments, each of the first and second alignment lines AL1 and AL2 may include a main line MAL and at least one sub-line SUL, e.g., a first sub-line SUL1 electrically connected to the main line MAL.

In some embodiments, the main line MAL of each of the first and second alignment lines AL1 and AL2 may be disposed in a same layer as at least one electrode of the display element layer LDL. For example, each main line MAL may be disposed in a same layer as at least one of first and second pixel electrodes ELT1 and ELT2. In an example, the first and second pixel electrodes ELT1 and ELT2 may be formed on a same layer in a same process to be spaced apart from each other, and each main line MAL may be formed in a same layer as first and second pixel electrodes ELT1 and ELT2 in a process of forming the first and second pixel electrodes ELT1 and ELT2. In an embodiment, the main line MAL constituting each first alignment line AL1 may be integrally formed with first pixel electrodes ELT1 disposed in at least one cell region 110A, and the main line constituting each second alignment line AL2 may be integrally formed with second pixel electrodes ELT2 disposed in at least one cell region 110A.

In another embodiment, each main line MAL may be disposed on a same layer as at least one of first and second capping layers CPL1 and CPL2 and first and second contact electrodes CNE1 and CNE2. In an example, each main line MAL may be formed in a same layer as first and second capping layers CPL1 and CPL2 in a process of forming the first and second capping layers CPL1 and CPL2, or be formed in a same layer as first and second contact electrodes CNE1 and CNE2 in a process of forming the first and second contact electrodes CNE1 and CNE2.

In still another embodiment, each main line MAL may be configured in a multi-layered structure including a plurality of conductive layers disposed in a same layer as each of a plurality of electrodes disposed in different layers among the first and second pixel electrodes ELT1 and ELT2, the first and second capping layers CPL1 and CPL2, and the first and second contact electrodes CNE1 and CNE2.

In some embodiments, the sub-line of each of the first and second alignment lines AL1 and AL2 may be disposed in a same layer as at least one electrode formed in the pixel circuit layer PCL. In an example, the sub-line of each of the first and second alignment lines AL1 and AL2 may include a first sub-line SUL1 disposed together with the first electrode ET1 of the transistor T between the third and fourth insulating layers INS3 and INS4.

Figure 7:
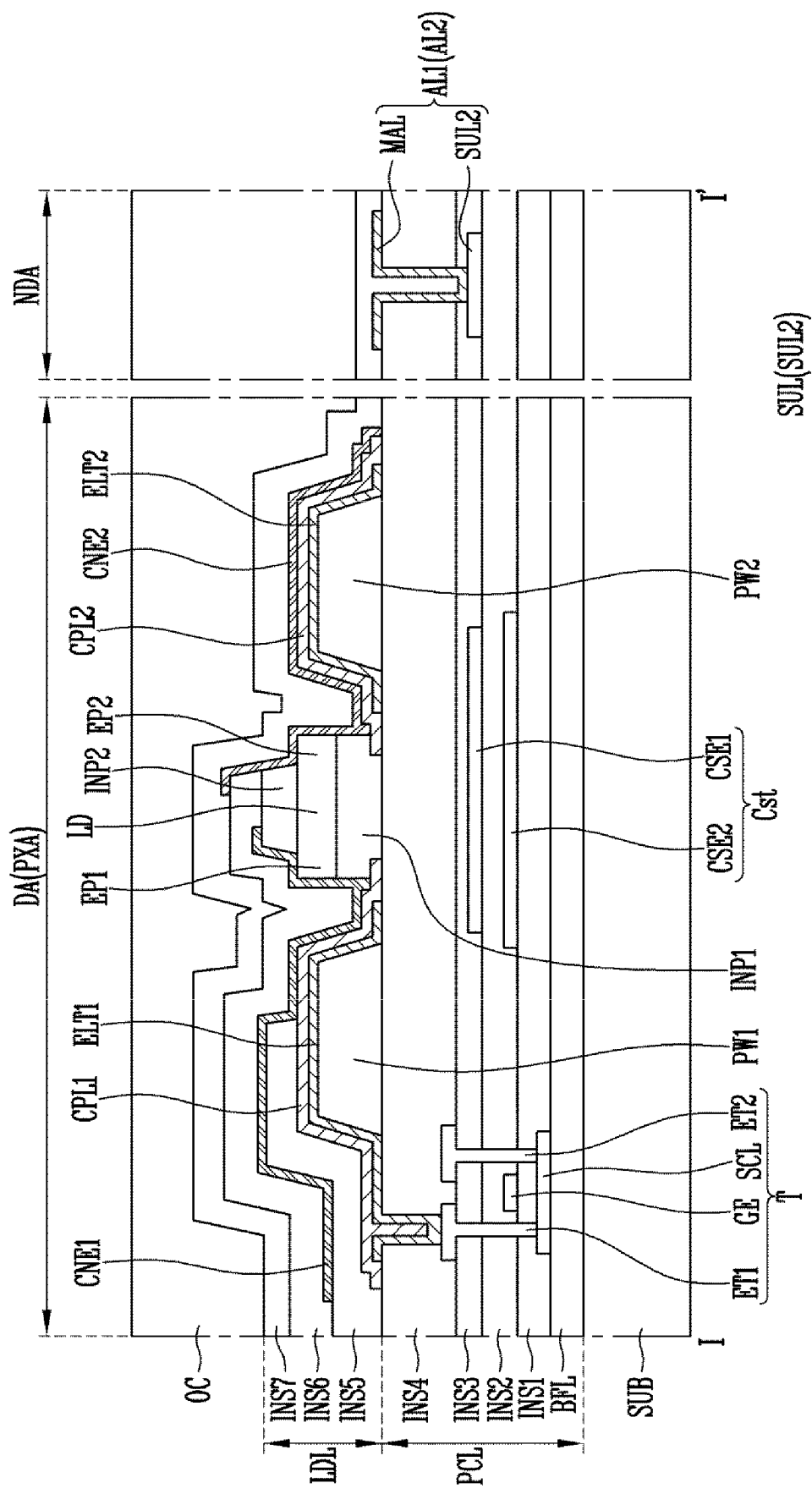
Figure 8:
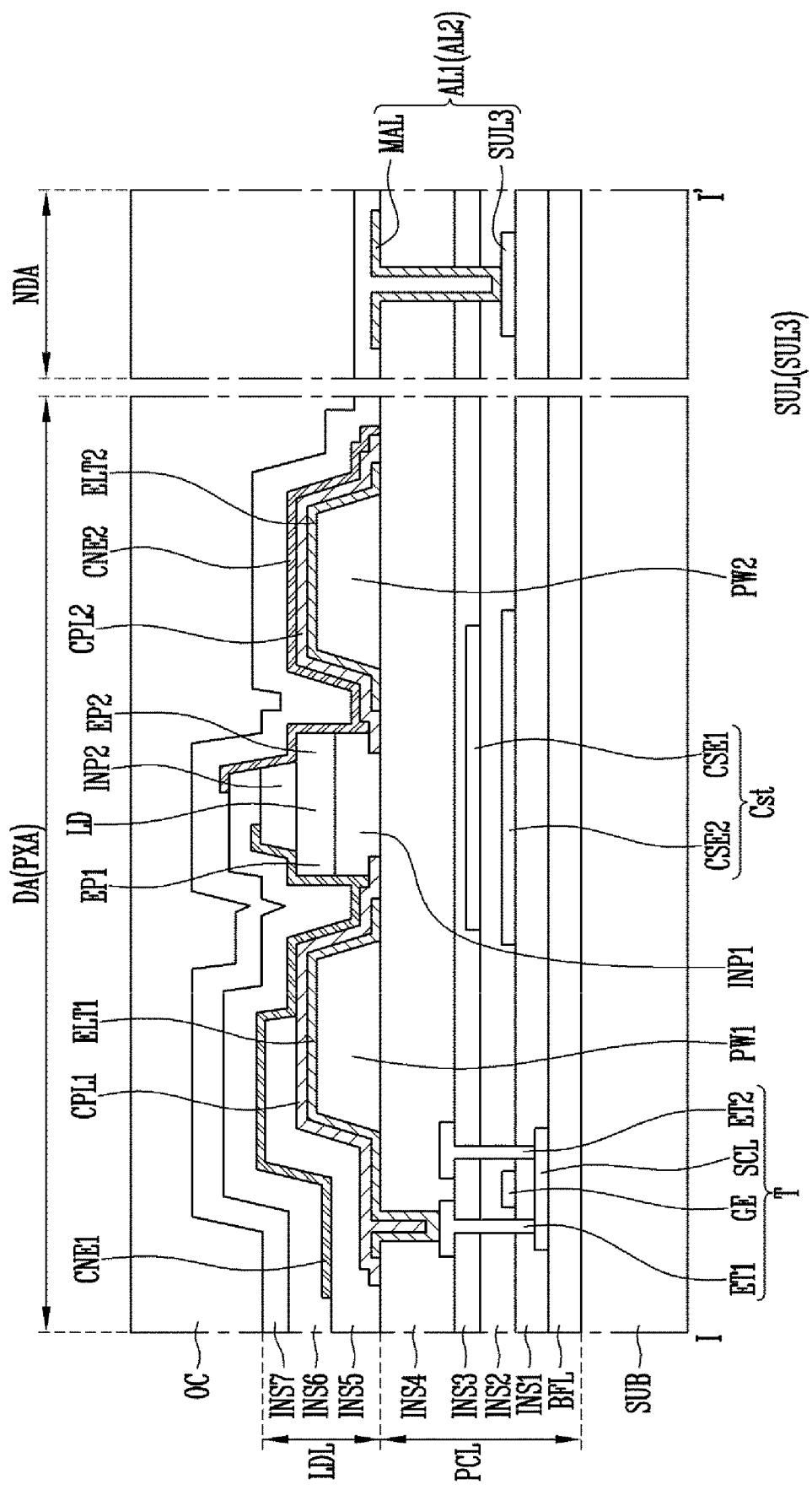
Figure 9:
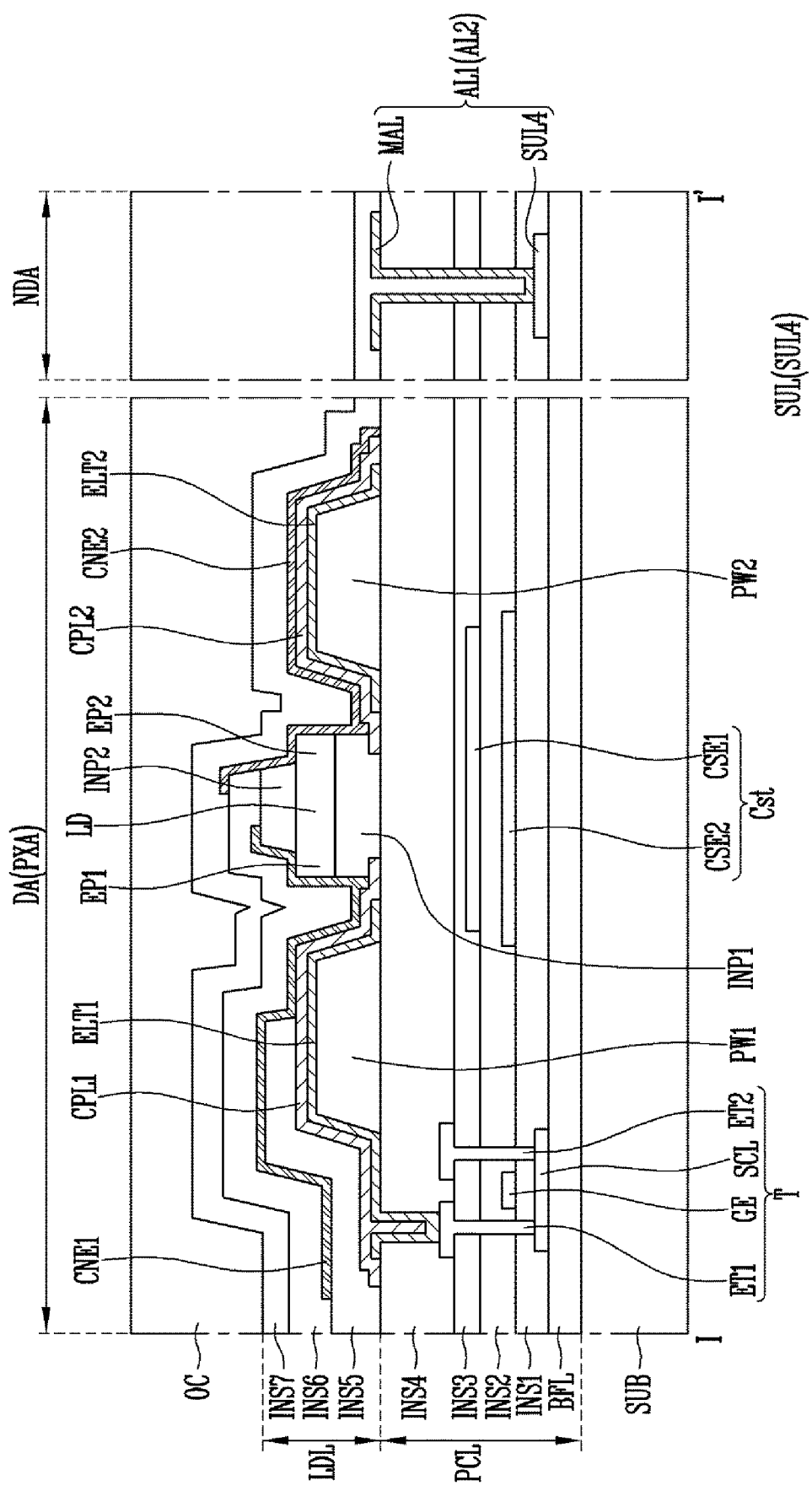

In another embodiment, the sub-line of each of the first and second alignment lines AL1 and AL2 may include a second sub-line SUL2 disposed together with the first capacitor electrode CSE1 between the second and third insulating layers INS2 and INS3 as shown in FIG. 7, or include a third sub-line SUL3 disposed together with the gate electrode GE of the transistor T and the second capacitor electrode CSE2 between the first and second insulating layers INS1 and INS2 as shown in FIG. 8. In still another embodiment, the sub-line of each of the first and second alignment lines AL1 and AL2 may include a fourth sub-line SUL4 disposed together with the semiconductor layer SCL of the transistor T between the buffer layer BFL on the substrate SUB and the first insulating layer INS1 as shown in FIG. 9.

In some embodiments, the sub-line of each of the first and second alignment lines AL1 and AL2 may have a multi-layered structure including at least two sub-lines among the first sub-line SUL1 disposed between the third and fourth insulating layers INS3 and INS4, the second sub-line SUL2 disposed between the second and third insulating layers INS2 and INS3, the third sub-line SUL3 disposed between the first and second insulating layers INS1 and INS2, and the fourth sub-line SUL4 disposed between the substrate SUB and the first insulating layer INS1.

Figure 10:
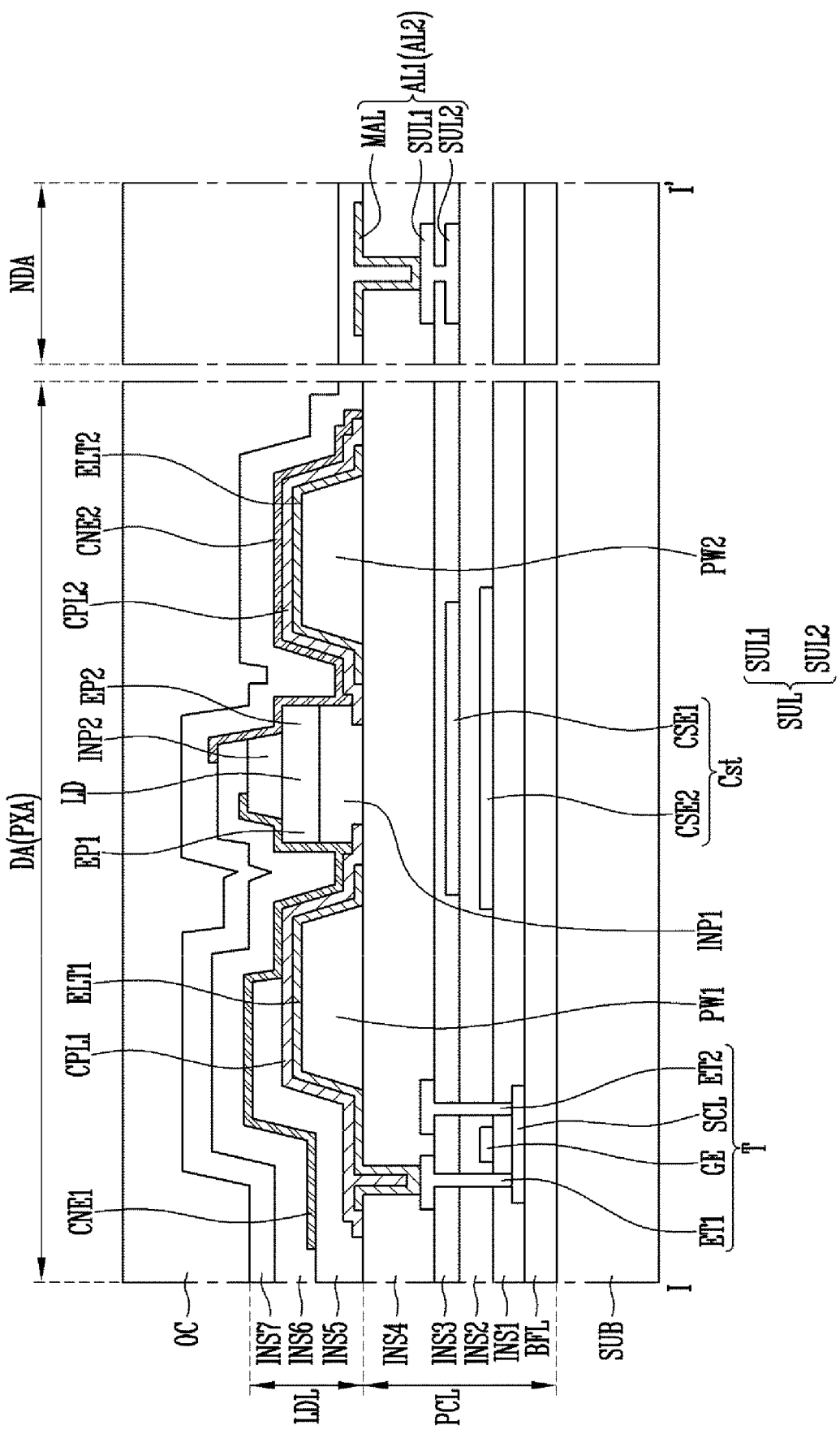
Figure 11:
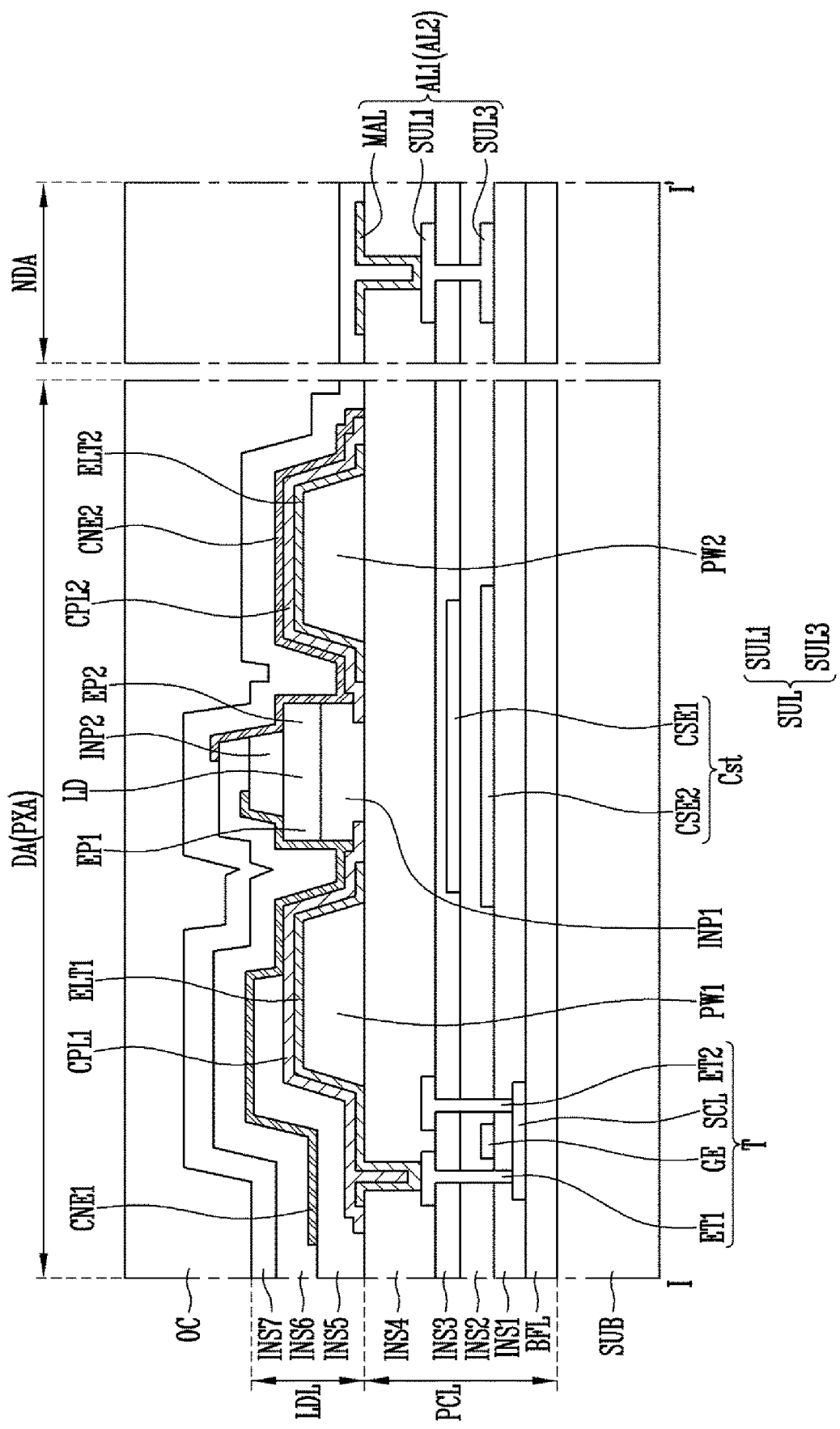
Figure 12:
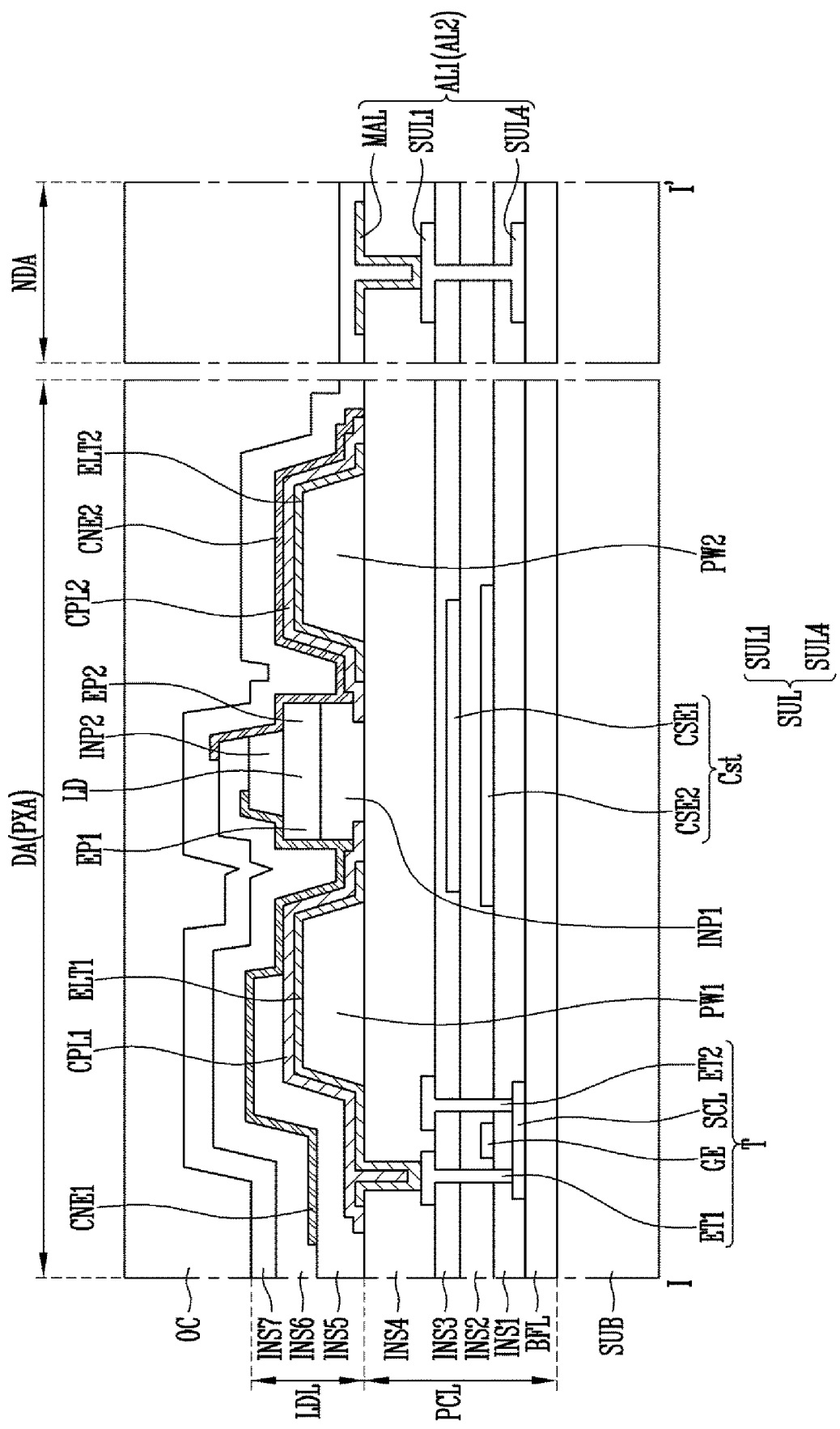
Figure 13:
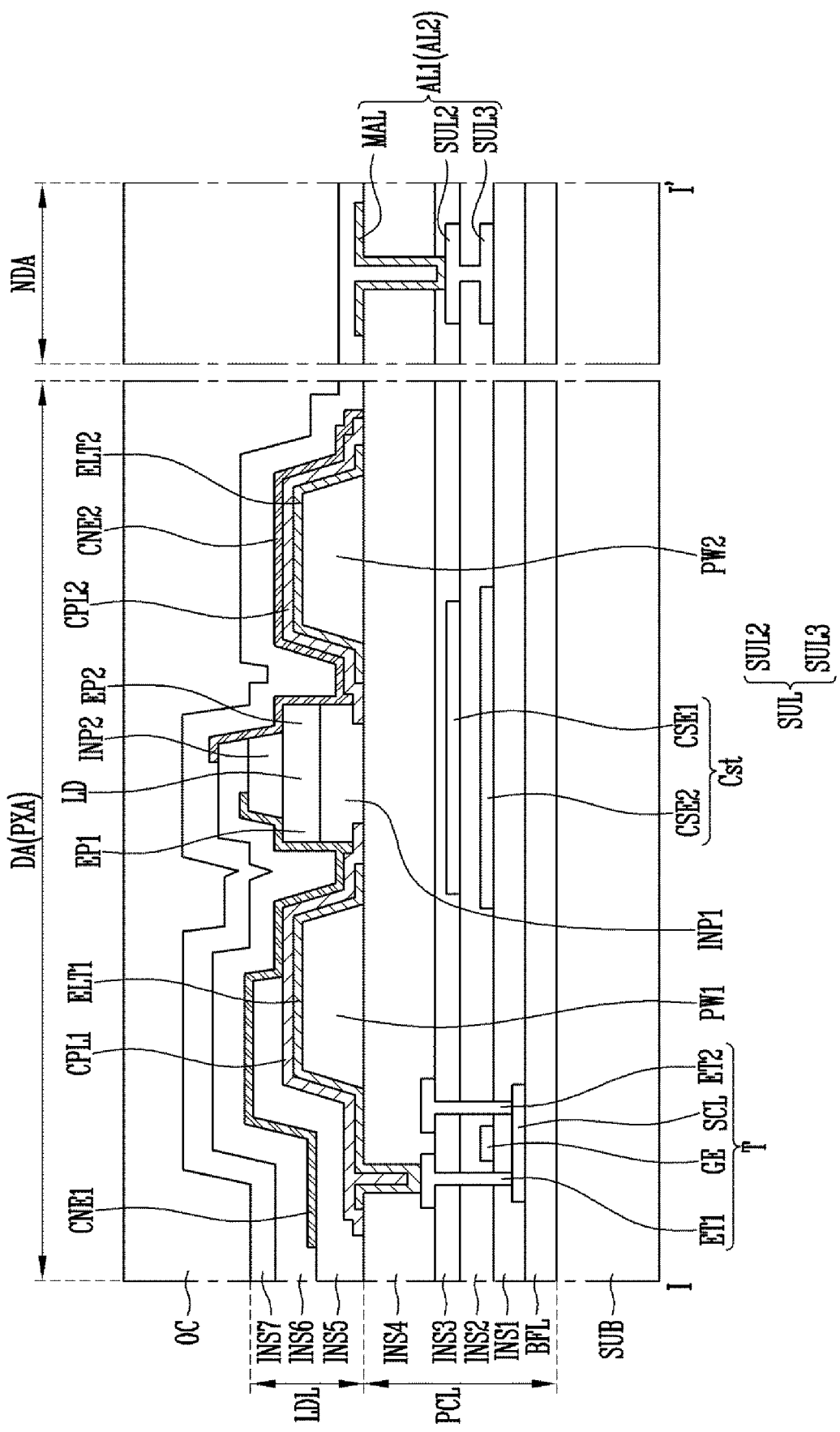
Figure 14:
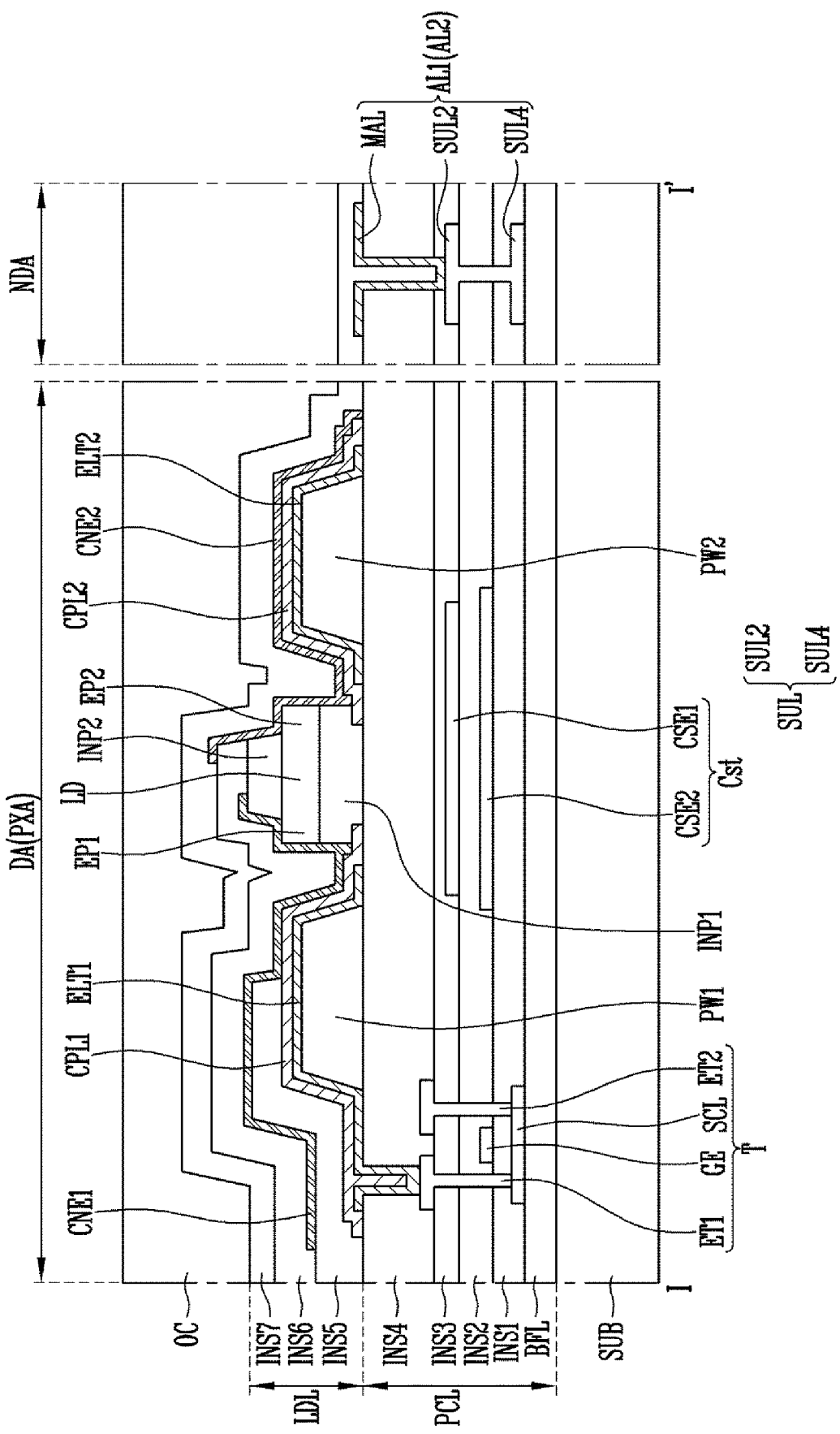
Figure 15:
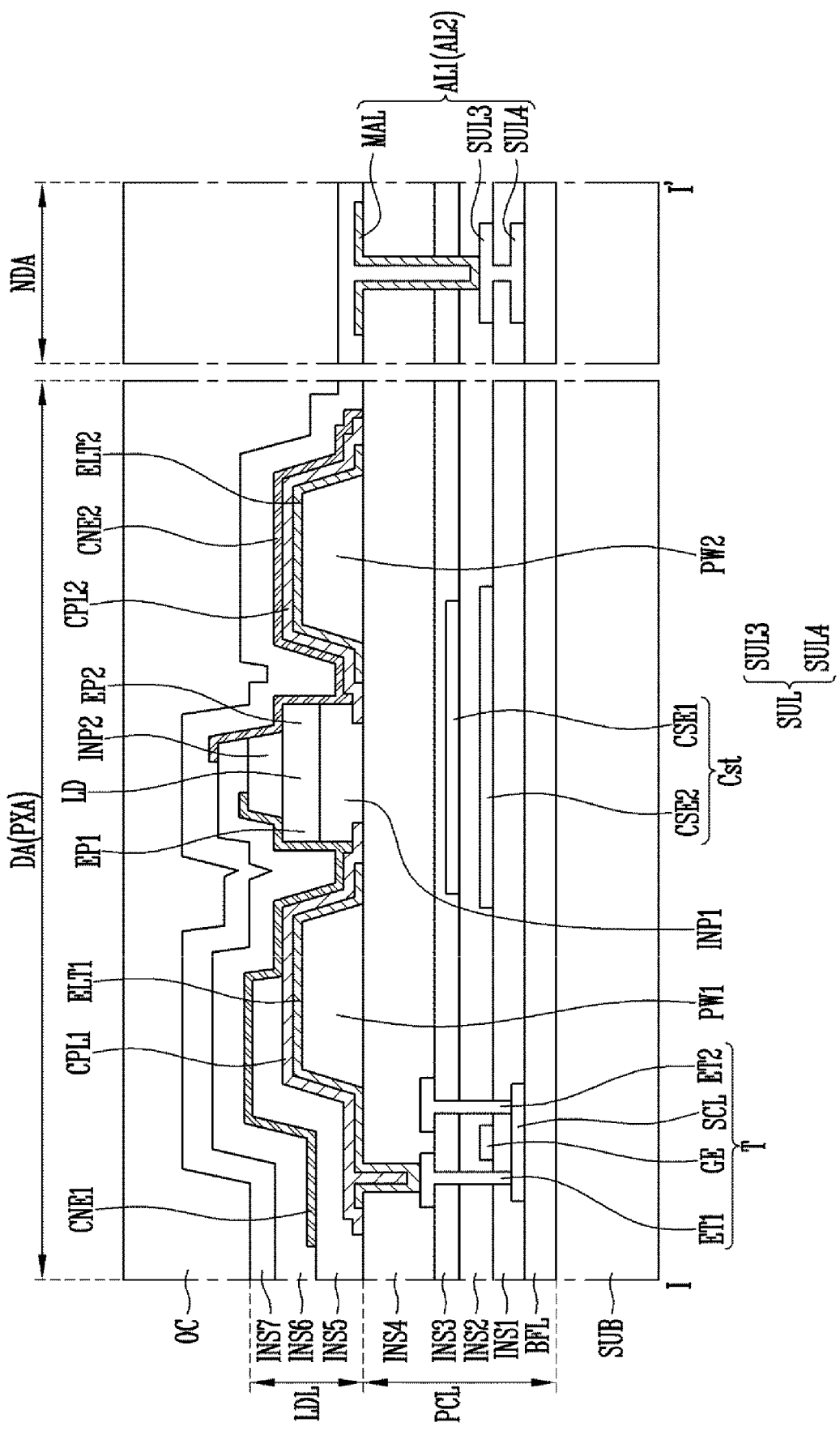

In an example, the sub-line of each of the first and second alignment lines AL1 and AL2 may have a multi-layered structure including the first and second sub-lines SUL1 and SUL2 as shown in FIG. 10. In another embodiment, the sub-line of each of the first and second alignment lines AL1 and AL2 may have a double-layered structure including the first and third sub-lines SUL1 and SUL3 as shown in FIG. 11, have a double-layered structure including the first and fourth sub-lines SUL1 and SUL4 as shown in FIG. 12, have a double-layered structure including the second and third sub-lines SUL2 and SUL3 as shown in FIG. 13, have a double-layered structure including the second and fourth sub-lines SUL2 and SUL4 as shown in FIG. 14, or have a double-layered structure including the third and fourth sub-lines SUL3 and SUL4 as shown in FIG. 15.

Figure 16:
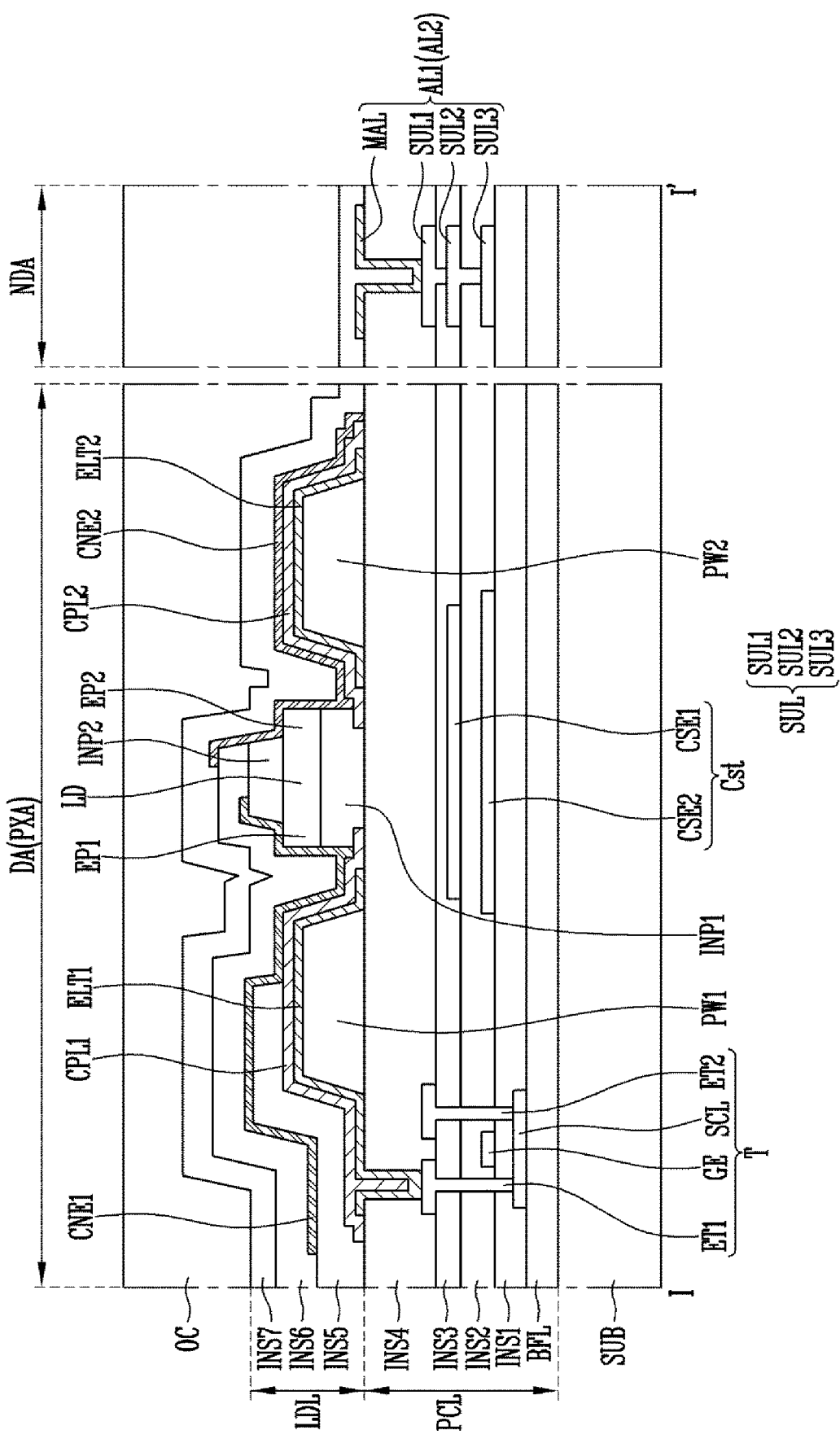
Figure 17:
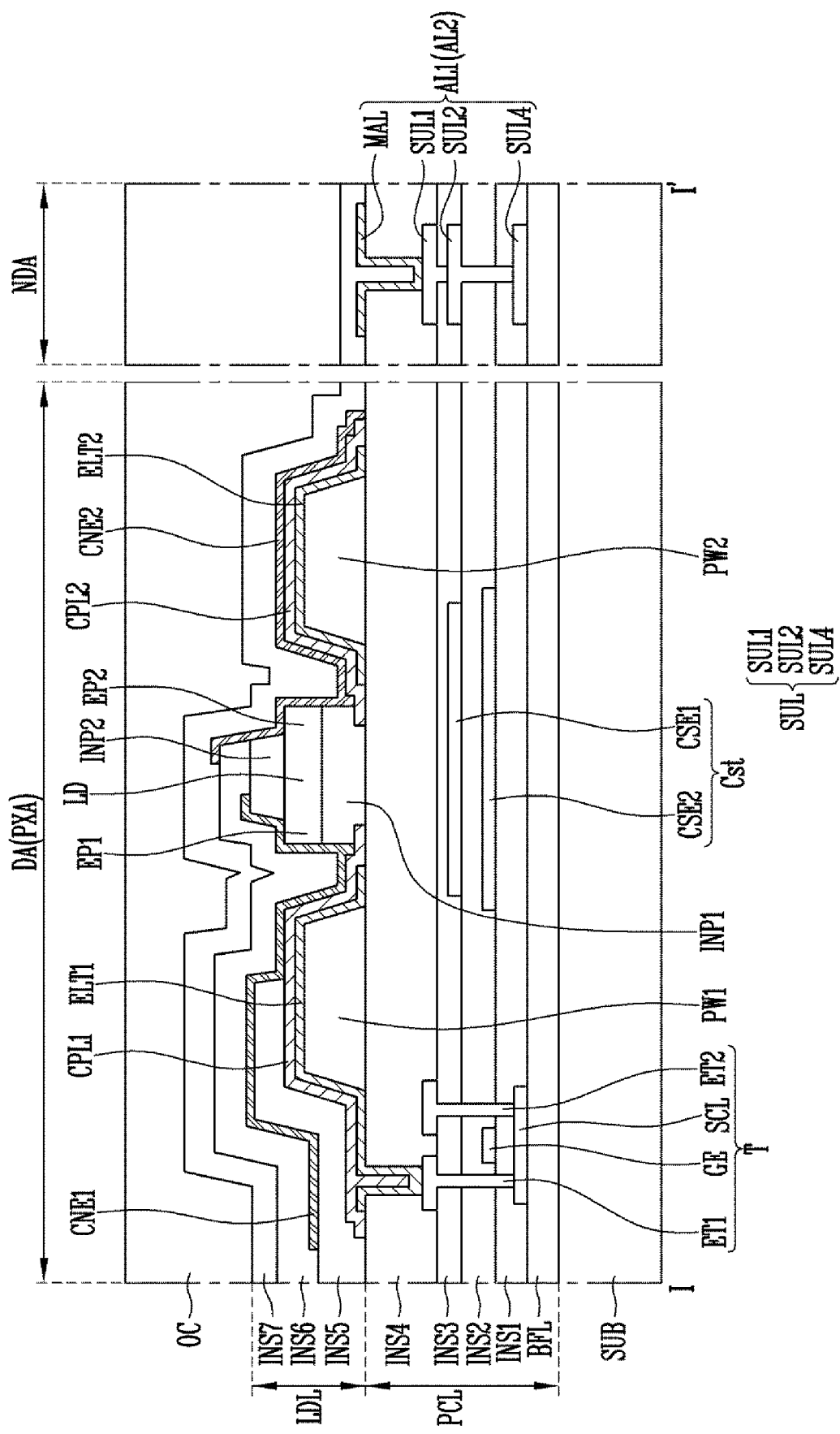
Figure 18:
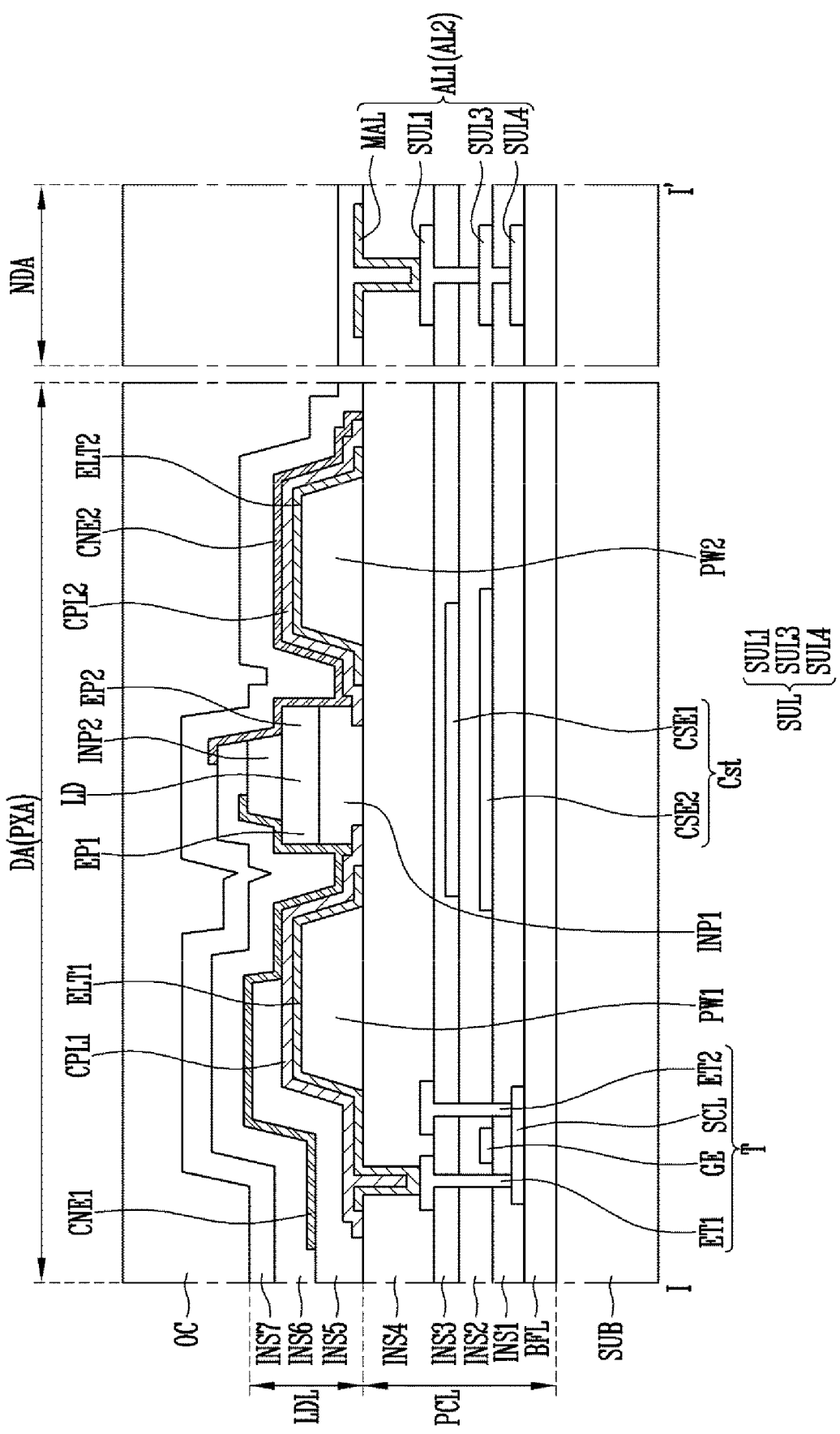
Figure 19:
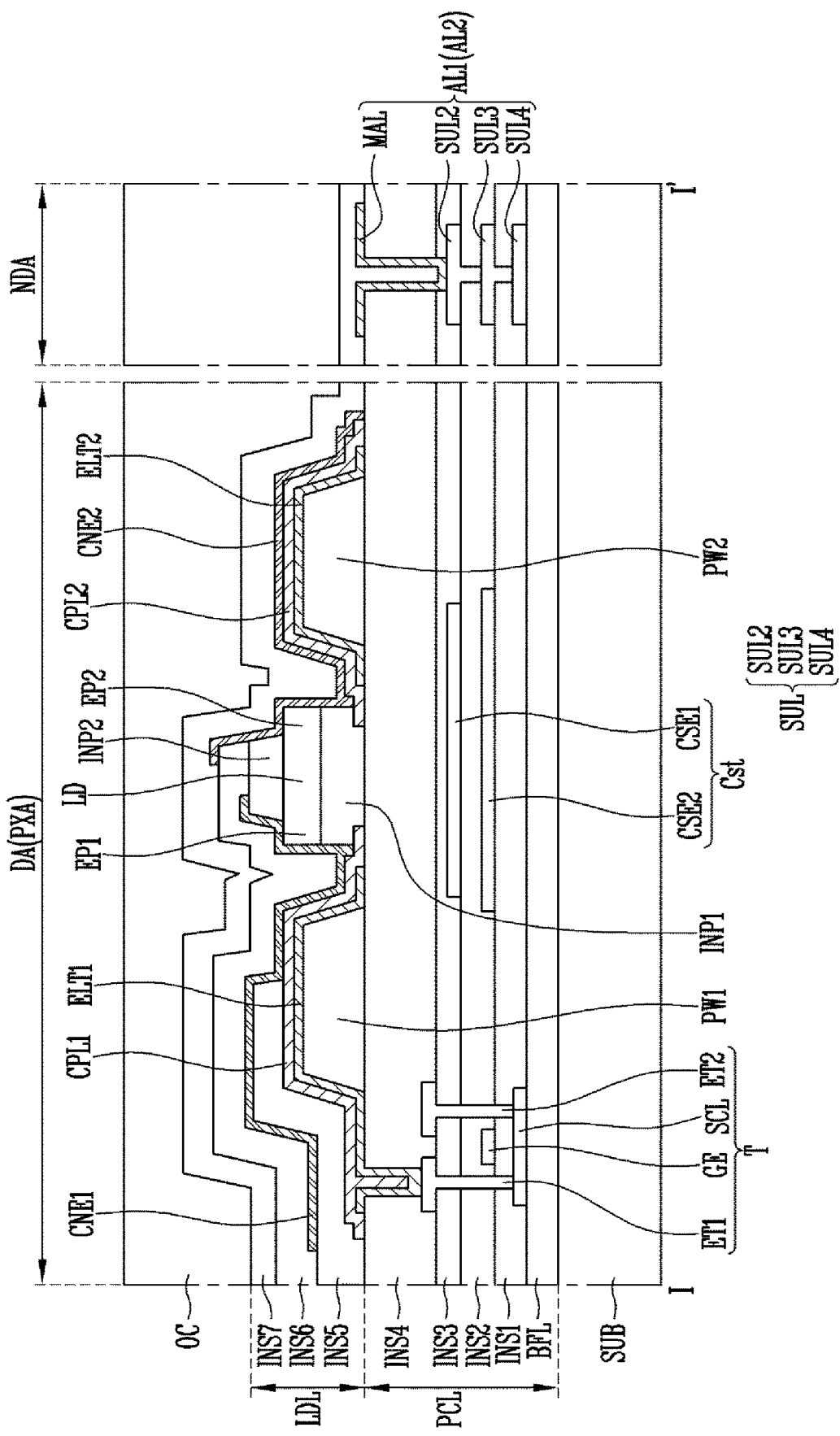

In another embodiment, the sub-line of each of the first and second alignment lines AL1 and AL2 may have a triple-layered structure including first, second, and third sub-lines SUL1, SUL2, and SUL3 as shown in FIG. 16, have a triple-layered structure including first, second, and fourth sub-lines SUL1, SUL2, and SUL4 as shown in FIG. 17, have a triple-layered structure including first, third, and fourth sub-lines SUL1, SUL3, and SUL4 as shown in FIG. 18, or have a triple-layered structure including second, third, and fourth sub-lines SUL2, SUL3, and SUL4 as shown in FIG. 19.

Figure 20:
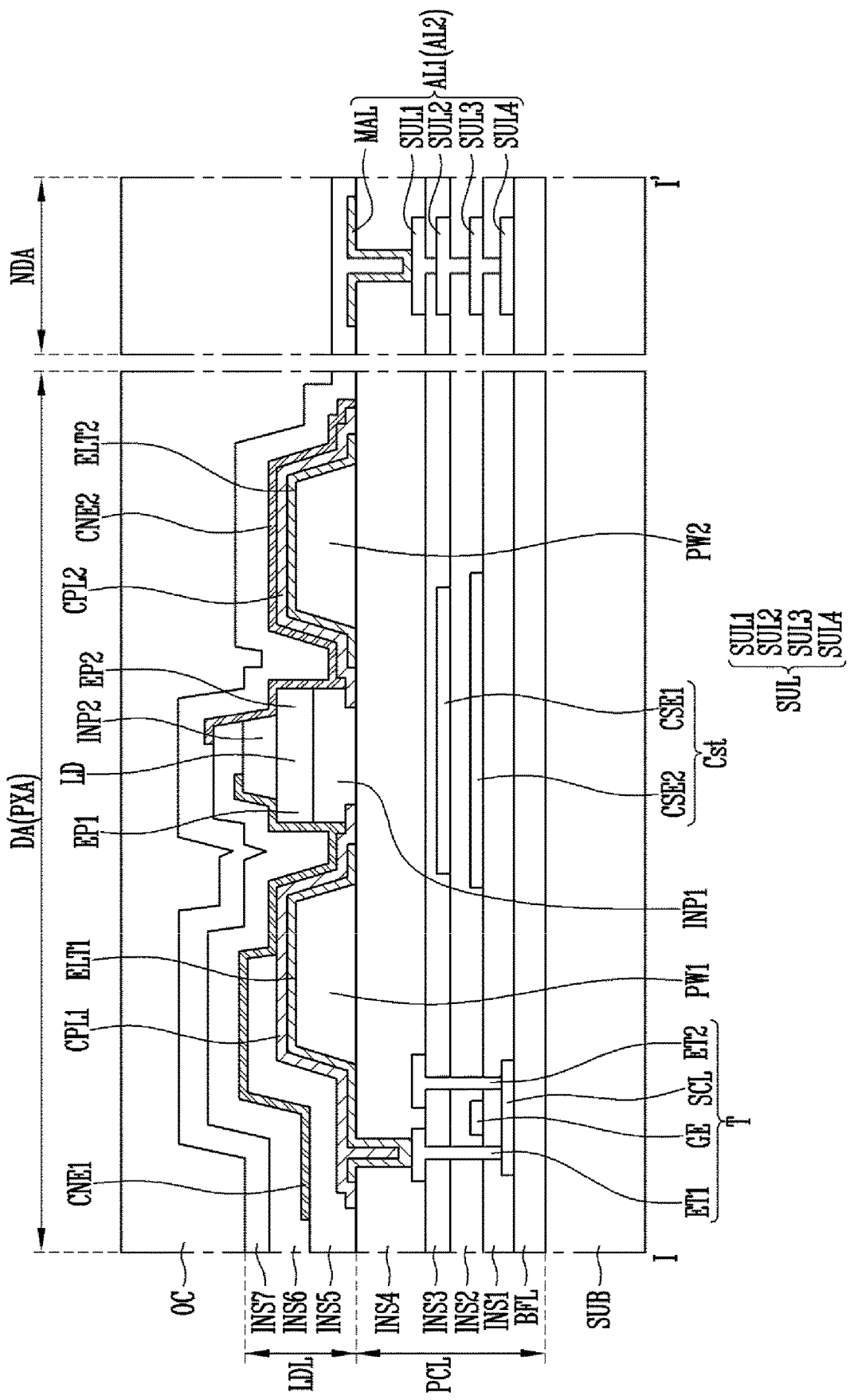

In another embodiment, the sub-line of each of the first and second alignment lines AL1 and AL2 may have a quadruple-layered structure including all the first, second, third, and fourth sub-lines SUL1, SUL2, SUL3, and SUL4 as shown in FIG. 20.

That is, in the present disclosure, the multi-layered structure of each of the first and second alignment lines AL1 and AL2 may be variously modified. In particular, when the first and second alignment lines AL1 and AL2 each having the multi-layered structure including the main line MAL and the sub-line SUL, which are disposed in same layers as at least a portion of the electrodes formed in the display region DA, are configured as illustrated in the above-described embodiments, the resistance of each of the first and second alignment lines AL1 and AL2 can be effectively decreased without adding a separate mask process. Accordingly, a desired alignment voltage can be transferred to the first and second pixel electrodes ELT1 and ELT2 disposed in each pixel region PXA in the process of aligning the light emitting devices LD. Further, a desired alignment voltage can be uniformly transferred to cell regions 110A for respectively fabricating a plurality of light emitting display panels 110 on the mother substrate 100 for concurrently (e.g., simultaneously) fabricating the light emitting display panels. Accordingly, light emitting devices LD can be easily aligned in each pixel region PXA of the light emitting display device. In addition, the alignment quality of the light emitting devices LD can be improved, and the fabrication efficiency of the light emitting display device can be improved.

Figure 21:
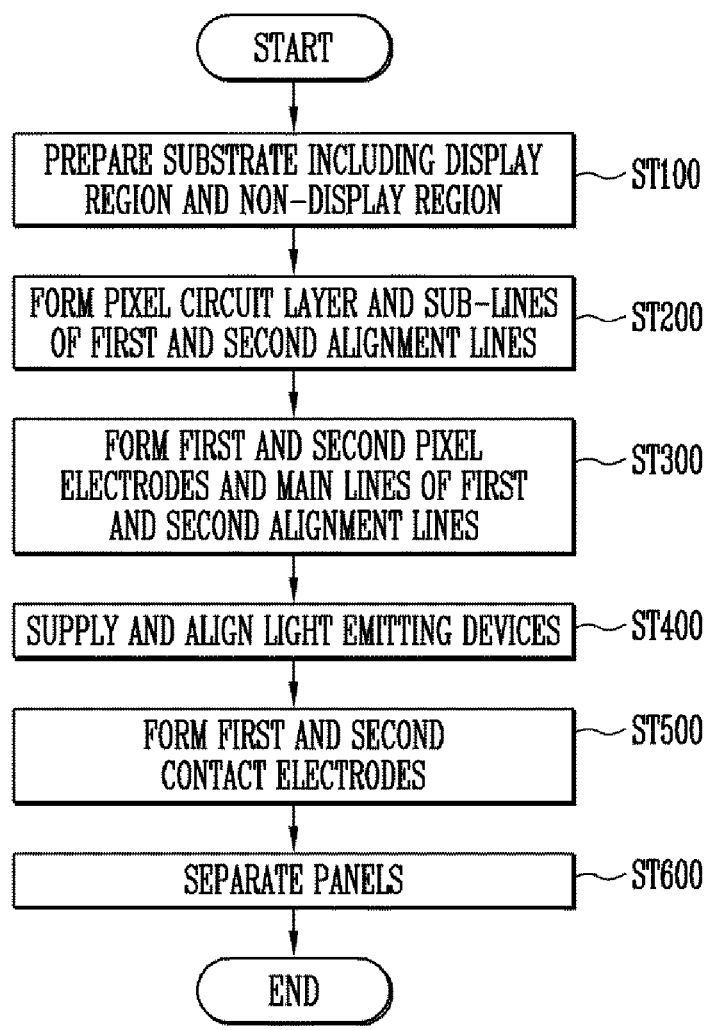
FIG. 21 is a flowchart illustrating a fabricating method of a light emitting display device according to an embodiment of the present disclosure.

FIG. 21 is a flowchart illustrating a fabricating method of a light emitting display device according to an embodiment of the present disclosure. Herein, the fabricating method according to an embodiment of the present disclosure will be schematically illustrated with reference to FIG. 21 in conjunction with the embodiments described in FIGS. 1 to 20.

First, in a step ST100, a substrate SUB for fabricating a light emitting display device, particularly, a light emitting display panel 110 according to an embodiment of the present disclosure is prepared. In some embodiments, the substrate SUB may be a base member of a mother substrate 100 for concurrently (e.g., simultaneously) fabricating a plurality of light emitting display panels 110, but the present disclosure is not limited thereto. For example, in another embodiment, the substrate SUB may be a base member for individually fabricating each light emitting display panel 110.

In some embodiments, a display region DA and a non-display region NDA, which correspond to at least one light emitting display panel 110, may be defined in the substrate SUB. In an example, the substrate SUB may include cell regions 110A for fabricating the respective light emitting display panels 110, and each cell region 110A may include a display region DA and a non-display region NDA. In some embodiments, each display region DA may include a plurality of pixel regions PXA, and each non-display region NDA may be disposed at a periphery of a corresponding display region DA.

In a step ST200, when the substrate SUB is prepared, a pixel circuit layer PCL is formed on each display region DA of the substrate SUB, and, at the same time, a sub-line SUL of each of first and second alignment lines AL1 and AL2 is formed on each non-display region NDA of the substrate SUB. In some embodiments, each sub-line SUL may be formed in a same layer in a same process as at least one electrode formed in the pixel circuit layer PCL. Also, each sub-line SUL may be provided in a single layer or a multi-layer. That is, the process of forming each sub-line SUL may include a process of forming at least one electrode in the pixel circuit layer PCL, and, at the same time, forming at least one sub-line, e.g., at least one of first to fourth sub-lines SUL1 to SUL4 in a same layer as the at least one electrode.

Next, in a step ST300, first and second pixel electrodes ELT1 and ELT2 are formed on the substrate SUB on which the pixel circuit layer PCL and the sub-lines SUL of the first and second alignment lines AL1 and AL2, and, at the same time, a main line MAL of each of the first and second alignment lines AL1 and AL2 is formed. In some embodiments, the first and second pixels ELT1 and ELT2 may be formed in each pixel region PXA of each display region DA. In addition, the main lines MAL of the first and second alignment lines AL1 and AL2 may be respectively connected to the first pixel electrodes ELT1 and the second pixel electrodes ELT2. Also, the main lines MAL of the first and second alignment lines AL1 and AL2 may be electrically connected to the sub-lines SUL of the first and second alignment lines AL1 and AL2, respectively. In an example, the process of forming each main line MAL may include a process of respectively forming the main lines MAL of the first and second alignment lines AL1 and AL2 on the sub-lines SUL of the first and second alignment lines to be electrically connected to the sub-lines SUL.

Next, in a step ST400, light emitting devices LD are supplied onto the substrate SUB on which the first and second pixel electrodes ELT1 and ELT2 and the first and second alignment lines AL1 and AL2 are formed. In some embodiments, a plurality of light emitting devices LD may be supplied onto each pixel region PXA of the display region DA, using any of various techniques including an inkjet technique and the like. In addition, power is applied to the first and second alignment lines AL1 and AL2 through first and second alignment pads AP1 and AP2 at the same time when the light emitting devices LD are supplied or after the light emitting devices LD are supplied, such that the light emitting devices LD are aligned between the first and second pixel electrodes ELT1 and ELT2 connected to the first and second alignment lines AL1 and AL2.

Next, in a step ST500, first and second contact electrodes CNE1 and CNE2 are formed on the substrate SUB on which the light emitting devices LD are aligned. In some embodiments, each first contact electrode CNE1 may connect a first end portion EP1 of at least one of the light emitting devices LD to a first pixel electrode ELT1 disposed in a corresponding pixel region PXA. In addition, each second contact electrode CNE2 may connect a second end portion EP2 of at least one of the light emitting devices LD to a second pixel electrode ELT2 disposed in a corresponding pixel region PXA.

Next, in a step ST600, a cutting process is performed along a scribing line SCL, etc., such that the light emitting display panels 110 concurrently (e.g., simultaneously) formed on the mother substrate 100 are individually separated. Subsequently, a module process and the like may be performed on each light emitting display panel 110.

In a light emitting display device and a fabricating method thereof according to the present disclosure, an electric field can be applied to each pixel region of a display region by using first and second alignment lines disposed in a non-display region at the periphery of the display region. Accordingly, light emitting devices can be easily aligned in each pixel region.

Further, in a light emitting display device and a fabricating method thereof according to the present disclosure, each of the first and second alignment lines has a multi-layered structure including a main line disposed in a same layer as at least one electrode disposed in a display element layer including a plurality of light emitting devices, and a sub-line disposed in a same layer as at least one electrode disposed in a pixel circuit layer. Thus, a voltage drop can be reduced by decreasing the resistance of each of the first and second alignment lines without adding a separate mask process. Accordingly, a desired voltage can be transferred to first and second pixel electrodes of each pixel in a process of aligning light emitting devices.

Further, in a light emitting display device and a fabricating method thereof according to the present disclosure, a desired voltage can be uniformly transferred to cell regions respectively corresponding to light emitting display panels on a mother substrate. Accordingly, light emitting devices can be easily aligned in each pixel region of the light emitting display device, and the fabrication efficiency of the light emitting display device can be improved.

While the present invention has been described in connection with certain embodiments, it will be understood by those skilled in the art that various modifications and changes can be made thereto without departing from the spirit and scope of the invention as set forth in the appended claims.

Thus, the scope of the invention should not be limited by the particular embodiments described herein but should be defined by the appended claims and equivalents thereof.

What is claimed is:
1. A light emitting display device comprising:
   a substrate comprising a display region comprising a plurality of pixel regions, and a non-display region outside an outer periphery of the display region;
   a pixel circuit layer comprising a plurality of circuit elements in the display region;
   a display element layer comprising a plurality of light emitting devices in the display region on the pixel circuit layer; and
   first and second alignment lines in the non-display region, the first and second alignment lines each having a multi-layered structure in the non-display region,
   wherein each of the first and second alignment lines comprises:
   a main line in a same layer as at least one electrode in the display element layer; and
   at least one sub-line electrically connected to the main line, the at least one sub-line in a same layer as at least one electrode in the pixel circuit layer,
   wherein the display element layer comprises:
   first and second pixel electrodes in each pixel region on the pixel circuit layer; and
   the light emitting devices between the first and second pixel electrodes of the pixel region, wherein the first and second pixel electrodes are in a same layer in the pixel region to be spaced apart from each other, and
wherein first end portions of the light emitting devices are electrically connected to the first pixel electrode of a corresponding pixel in the pixel region, and second end portions of the light emitting devices are electrically connected to the second pixel electrode of the corresponding pixel.

2. The light emitting display device of claim 1, wherein the first and second alignment lines are at opposite sides of the non-display region with the display region therebetween.

3. The light emitting display device of claim 1, wherein the first alignment line is spaced from pixels of the display region, and
the second alignment line is connected to the pixels of the display region.

4. The light emitting display device of claim 1, wherein the display element layer comprises:
first and second pixel electrodes in each pixel region on the pixel circuit layer; and
the light emitting devices between the first and second pixel electrodes of the pixel region.

5. The light emitting display device of claim 4, wherein the main line of each of the first and second alignment lines is in a same layer as at least one of the first and second pixel electrodes.

6. The light emitting display device of claim 1, wherein the display element layer further comprises:
first contact electrodes on the first end portions of the light emitting devices to connect the first end portions of the light emitting devices to the first pixel electrode of the corresponding pixel; and
second contact electrodes on the second end portions of the light emitting devices to connect the second end portions of the light emitting devices to the second pixel electrode of the corresponding pixel.

7. The light emitting display device of claim 1, wherein each of the light emitting devices comprises:
a first semiconductor layer doped with a first conductive dopant;
a second semiconductor layer doped with a second conductive dopant; and
an active layer between the first semiconductor layer and the second semiconductor layer.

8. The light emitting display device of claim 1, further comprising a first insulating layer, a second insulating layer, a third insulating layer, and a fourth insulating layer, which are sequentially stacked between the substrate and the display element layer.

9. The light emitting display device of claim 8, wherein the pixel circuit layer comprises a transistor in each pixel region of the display region,
wherein the transistor comprises:
a semiconductor layer between the substrate and the first insulating layer;
a gate electrode between the first insulating layer and the second insulating layer, the gate electrode overlapping with at least one region of the semiconductor layer; and
a first electrode between the third insulating layer and the fourth insulating layer, the first electrode being electrically connected to the semiconductor layer.

10. The light emitting display device of claim 9, wherein the pixel circuit layer further comprises a capacitor in each pixel region of the display region,
wherein the capacitor comprises:
a first capacitor electrode between the second insulating layer and the third insulating layer; and
a second capacitor electrode in a same layer as at least one of the semiconductor layer, the gate electrode, and the first electrode.

11. The light emitting display device of claim 9, wherein the at least one sub-line comprises at least one of:
a first sub-line between the third insulating layer and the fourth insulating layer;
a second sub-line between the second insulating layer and the third insulating layer;
a third sub-line between the first insulating layer and the second insulating layer; and
a fourth sub-line between the substrate and the first insulating layer.

12. The light emitting display device of claim 11, wherein the at least one sub-line has a multi-layered structure including at least two sub-lines among the first to fourth sub-lines.

13. The light emitting display device of claim 9, wherein the at least one sub-line comprises one of:
a first sub-line between the third insulating layer and the fourth insulating layer;
a second sub-line between the second insulating layer and the third insulating layer;
a third sub-line between the first insulating layer and the second insulating layer; or
a fourth sub-line between the substrate and the first insulating layer.

14. A light emitting display device comprising:
a substrate comprising a display region comprising a plurality of pixel regions, and a non-display region outside an outer periphery of the display region;
a pixel circuit layer comprising a plurality of circuit elements in the display region;
a display element layer comprising a plurality of light emitting devices in the display region on the pixel circuit layer; and
first and second alignment lines in the non-display region, the first and second alignment lines each having a multi-layered structure in the non-display region,
wherein each of the first and second alignment lines comprises:
a main line in a same layer as at least one electrode in the display element layer; and
at least one sub-line electrically connected to the main line, the at least one sub-line in a same layer as at least one electrode in the pixel circuit layer,
wherein each of the light emitting devices comprises:
a first semiconductor layer doped with a first conductive dopant;
a second semiconductor layer doped with a second conductive dopant; and
an active layer between the first semiconductor layer and the second semiconductor layer, and
wherein each of the light emitting devices is a bar type light emitting diode having a micro or nano scale.

15. A method of fabricating a light emitting display device, the method comprising:
preparing a substrate comprising a display region comprising a plurality of pixel regions, and a non-display region outside an outer periphery of the display region;
forming a pixel circuit layer on the display region of the substrate, and forming at least one sub-line of each of a first alignment line and a second alignment line on the non-display region of the substrate;

forming a first pixel electrode and a second pixel electrode on each pixel region of the plurality of pixel regions of the display region, and forming a main line of each of the first alignment line and the second alignment line on the non-display region of the substrate;

supplying a plurality of light emitting devices onto the pixel region, and aligning the light emitting devices by applying power to the first alignment line and the second alignment line; and forming a first contact electrode and a second contact electrode, which respectively connect a first end portion and a second end portion of each of the light emitting devices to the first pixel electrode and the second pixel electrode, wherein each of the light emitting devices comprises:

a first semiconductor layer doped with a first conductive dopant;

a second semiconductor layer doped with a second conductive dopant; and an active layer between the first semiconductor layer and the second semiconductor layer, and wherein each of the light emitting devices is a bar type light emitting diode having a micro or nano scale.

16. The method of claim 15, wherein the forming of the at least one sub-line includes forming at least one electrode in the pixel circuit layer and forming the at least one sub-line of each of the first and second alignment lines in a same layer as the at least one electrode.

17. The method of claim 15, wherein the forming of the main line includes forming the main line of each of the first and second alignment lines over the at least one sub-line of each of the first and second alignment lines to be electrically connected to the at least one sub-line.

18. The method of claim 15, wherein the main line of each of the first and second alignment lines is formed in a same layer as at least one of the first pixel electrode and the second pixel electrode.

* * * * *